United States Patent
Mostafalu et al.

(10) Patent No.: US 11,758,300 B2
(45) Date of Patent: *Sep. 12, 2023

(54) SOLID-STATE IMAGING DEVICE AND IMAGING DEVICE WITH COMBINED DYNAMIC VISION SENSOR AND IMAGING FUNCTIONS

(71) Applicant: Sony Semiconductor Solutions Corporation, Kanagawa (JP)

(72) Inventors: Pooria Mostafalu, Penfield, NY (US); Frederick Brady, Webster, NY (US)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/582,361

(22) Filed: Jan. 24, 2022

(65) Prior Publication Data

US 2022/0150427 A1 May 12, 2022

Related U.S. Application Data

(63) Continuation of application No. 16/574,555, filed on Sep. 18, 2019, now Pat. No. 11,240,449.

(51) Int. Cl.
*H04N 25/702* (2023.01)
*H01L 27/146* (2006.01)
*H04N 25/75* (2023.01)

(52) U.S. Cl.
CPC ..... *H04N 25/702* (2023.01); *H01L 27/14605* (2013.01); *H04N 25/75* (2023.01); *H01L 27/14643* (2013.01)

(58) Field of Classification Search
CPC ...... H04N 5/3696; H04N 5/378; H04N 5/341; H04N 5/3745; H04N 5/3741; H04N 5/345;

(Continued)

(56) References Cited

U.S. PATENT DOCUMENTS 9,001,245 B2 4/2015 Wang et al.
9,986,179 B2 5/2018 Govil
(Continued)

FOREIGN PATENT DOCUMENTS

| EP | 3499872 | 6/2019 |
| WO | WO 2019/135303 | 7/2019 |
| WO | WO 2019/146527 | 8/2019 |

OTHER PUBLICATIONS

Posch et al., "A QVGA 143 dB Dynamic Range Frame-Free PWM Image Sensor With Lossless Pixel-Level Video Compression and Time-Domain CDS," IEEE Journal of Solid-State Circuits, vol. 46, No. 1, Jan. 2011, pp. 259-275.

(Continued)

*Primary Examiner* — Twyler L Haskins
*Assistant Examiner* — Angel L Garces-Rivera
(74) *Attorney, Agent, or Firm* — Sheridan Ross PC

(57) ABSTRACT

An imaging device includes a plurality of unit pixels or pixels, with each pixel separated from every other unit pixel by an isolation structure. Each unit pixel includes a photoelectric conversion unit, a pixel imaging signal readout circuit, and an address event detection readout circuit. A first transfer transistor selectively connects the photoelectric conversion unit to the pixel imaging signal readout circuit, and a second transfer transistor selectively connects the photoelectric conversion unit to the address event detection readout circuit. The photoelectric conversion unit, the pixel imaging signal readout circuit, the address event detection readout circuit, and the first and second transfer transistors for a given pixel are located within a pixel area defined by the isolation structure. The isolation structure may be in the form of a full thickness dielectric trench isolation structure.

20 Claims, 24 Drawing Sheets

(58) Field of Classification Search
CPC ...... H04N 25/702; H04N 25/75; H04N 25/40; H04N 25/766; H04N 25/77; H04N 25/44; H01L 27/14605; H01L 27/14643; H01L 27/14609; H01L 27/14621; H01L 27/1463

See application file for complete search history.

(56) References Cited

U.S. PATENT DOCUMENTS

| | | |
|---|---|---|
| 11,240,449 B2 * | 2/2022 | Mostafalu ......... H01L 27/14609 |
| 2011/0042552 A1 | 2/2011 | Furuya et al. |
| 2014/0291481 A1 | 10/2014 | Zhang et al. |
| 2016/0079282 A1 | 3/2016 | Sonsky |
| 2018/0124338 A1 | 5/2018 | Augusto et al. |
| 2018/0286895 A1 | 10/2018 | Watanabe et al. |
| 2018/0302581 A1 | 10/2018 | Watanabe et al. |
| 2019/0019820 A1 | 1/2019 | Takizawa et al. |

OTHER PUBLICATIONS

Official Action for U.S. Appl. No. 16/574,555, dated Jan. 7, 2021, 12 pages.
Official Action for U.S. Appl. No. 16/574,555, dated Jul. 12, 2021, 11 pages.
Notice of Allowance for U.S. Appl. No. 16/574,555, dated Sep. 29, 2021, 9 pages.

* cited by examiner

SOLID-STATE IMAGING DEVICE AND IMAGING DEVICE WITH COMBINED DYNAMIC VISION SENSOR AND IMAGING FUNCTIONS

CROSS REFERENCE TO RELATED APPLICATIONS

This application a continuation application of U.S. patent application Ser. No. 16/574,555 filed Sep. 18, 2019, the entire disclosure of which is incorporated herein by reference.

TECHNICAL FIELD

The present disclosure relates to an imaging device with both dynamic vison sensor and imaging capabilities.

BACKGROUND

In the related art, a synchronization-type solid-state imaging device that captures image data in synchronization with a synchronization signal such as a vertical synchronization signal has been used in an imaging device and the like. In the typical synchronization-type solid-state imaging device, it is difficult to acquire image data for every period of the synchronization signal (for example, for every $1/60$ seconds), and thus it is difficult to cope with cases in which relatively high-speed processing is demanded, such as in fields demanding high speed (e.g. real time) processing, such as autonomous vehicles, robotics, and the like. In this regard, there is suggested a non-synchronization-type solid-state imaging device in which a detection circuit is provided for every pixel to detect a situation in which a light-reception amount exceeds a threshold value as an address event in real time. The non-synchronization-type solid-state imaging device that detects the address event for every pixel is also referred to as a dynamic vision sensor (DVS).

SUMMARY

Technical Problem

A sensor with a combination of DVS and regular frame based imaging can be achieved using various methods. These include devices that feature time-based readout using additional photodiodes, known as asynchronous time-based image sensors (ATIS) systems. However, because ATIS systems require two photodiodes per pixel in order to provide image sensor and DVS signals, they suffer from degraded resolution and image quality as compared to arrangements that do not require additional photodiodes. Other devices feature pixels that provide image sensor signals and dynamic vision sensor (DVS) event signals using a common photodiode, known as dynamic and active pixel vision sensor (DAVIS) systems. However, DAVIS systems can suffer from interference between the image and event detection functions, as those functions are not well isolated. In addition, difficulty in readout of DVS and active image sensor signals in can degrade the dynamic range of DAVIS sensors.

Therefore, the present disclosure provides a solid-state imaging device and an imaging device which are capable of providing both imaging and event detection functions with improved light-reception efficiency as compared to other configurations.

Solution to Problem

In accordance with embodiments and aspects of the present disclosure, there is provided an imaging device comprising a plurality of photoelectric conversion regions or pixels arranged in a pixel array. Each pixel includes a single photoelectric conversion region, a first readout circuit selectively connected to the photoelectric conversion region by a first transfer gate or transfer transistor, and a second readout circuit selectively connected to the photoelectric conversion region by a second transfer gate or transfer transistor. Moreover, the photoelectric conversion region, first readout circuit, first transfer transistor, second readout circuit, and second transfer transistor of any one pixel in the pixel array is separated from the photoelectric conversion region, first readout circuit, first transfer transistor, second readout circuit, and second transfer transistor of any neighboring pixel in the pixel array by an isolation structure. The isolation structure can include a dielectric structure. The dielectric structure can be provided as a full-thickness rear deep trench isolation (RFTI) structure or as a full-thickness front deep trench isolation (FFTI) structure. In accordance with at least some embodiments of the present disclosure, the isolation structure surrounds each pixel in the pixel array. Accordingly, a relatively large photosensitive area can be enabled by using a single photoelectric conversion region for both image sensor and event detection functions in each pixel. In addition, isolation between adjacent pixels is provided by the isolation structure formed between adjacent pixels.

In accordance with further embodiments and aspects of the present disclosure, in each pixel, some or all of the components of the first readout circuit can be formed on or towards a first side of the photoelectric conversion region of the pixel, and some or all of the components of the second readout circuit can be formed on or towards a second side of the photoelectric conversion region of the pixel. In accordance with still further embodiments of the present disclosure, in each pixel, the first transfer transistor can be formed on a first side of the photoelectric conversion region of the pixel, and the second transfer transistor can be formed on a second side of the photoelectric conversion region of the pixel.

In accordance with still further embodiments and aspects of the present disclosure, the first transfer transistor of a pixel may be provided as a first one of an N-type device or a P-type device, and the second transfer transistor of the pixel may be provided as a second one of the N-type device or the P-type device. If the transfer gates are of different compositions (i.e. the first transfer transistor is N-type and the second transfer transistor is P-type or the first transfer transistor is P-type and the second transfer transistor is N-type) carriers for imaging and event-based detection would be different, allowing imaging and DVS detection modes to be available at the same time. Accordingly, in such a configuration, both imaging and DVS modes can be available simultaneously from a single pixel. In addition, enhanced isolation between imaging and DVS signals can be provided.

The present disclosure can provide imaging devices with dynamic vision sensing and imaging capabilities that are capable of improved light-reception efficiencies. In addition, the present disclosure can provide imaging devices with improved isolation between pixels.

DESCRIPTION OF EMBODIMENTS

Figure 1:
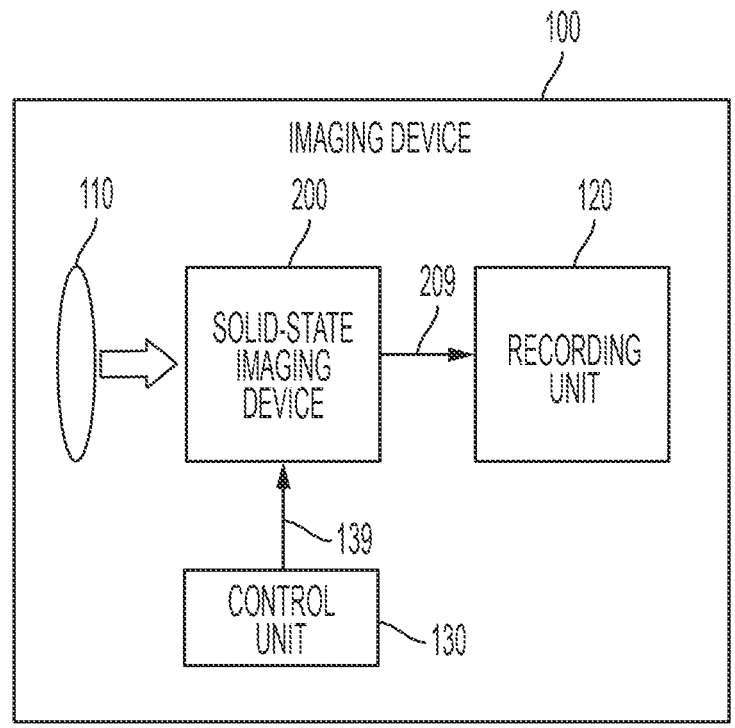
FIG. 1 is a block diagram illustrating a schematic configuration example of a solid-state imaging device in accordance with embodiments of the present disclosure.

Hereinafter, embodiments of the present disclosure will be described in detail on the basis of the accompanying drawings. Furthermore, in the following embodiments, the same reference numeral will be given to the same portion, and redundant description thereof will be omitted.

A typical dynamic vision sensor (DVS) employs a so-called event-driven type driving method in which the existence or nonexistence of address event ignition is detected for every unit pixel, and a pixel signal is read out from a unit pixel in which the address event ignition is detected.

Furthermore, the unit pixel in this description represents a minimum unit of a pixel or unit pixel including one photoelectric conversion element (also referred to as "light-receiving element"), and can correspond to each dot in image data that is read out from an image sensor as an example. In addition, the address event represents an event that occurs for every address that is allocable to each of a plurality of the unit pixels which are arranged in a two-dimensional lattice shape. An event detection sensor responds to a change in intensity asynchronously. Intensity change is correlated with a change in photocurrent, and if this change exceeds a constant threshold value it could be detected as an event.

FIG. 1 is a block diagram illustrating a schematic configuration example of an imaging device according to at least some embodiments of the present disclosure. As illustrated in FIG. 1, for example, an imaging device 100 includes an imaging lens 110, a solid-state imaging device 200, a recording unit 120, and a control unit 130. As examples, the imaging device 100 can be provided as or as part of a camera that is mounted in an industrial robot, an in-vehicle camera, or as part of or in connection with other devices or instruments.

The imaging lens 110 can include an optical system that directs (e.g. condenses) incident light and images an image of the incident light on a light-receiving surface of the solid-state imaging device 200, also referred to herein as simply an imaging device 200. The light-receiving surface is a surface of a substrate on which photoelectric conversion elements in the solid-state imaging device 200 are arranged. The solid-state imaging device 200 photoelectrically converts the incident light to generate image data. In addition, the solid-state imaging device 200 can execute predetermined signal processing such as noise removal and white balance adjustment with respect to the generated image data. A result obtained by the signal processing and a detection signal indicating the existence or nonexistence of an address event ignition are output to the recording unit 120 through a signal line 209. Furthermore, a method of generating the detection signal indicating the existence or nonexistence of the address event ignition will be described later.

The recording unit 120 is, for example, constituted by a flash memory, a dynamicrandom access memory (DRAM), a static random access memory (SRAM), or the like, and records data input from the solid-state imaging device 200.

The control unit 130 is, for example, constituted by a central processing unit (CPU) and the like, and outputs various instructions through a signal line 139 to control respective units such as the solid-state imaging device 200 in the imaging device 100.

Next, a configuration example of the solid-state imaging device 200 will be described in detail with reference to the accompanying drawings.

Figure 2:
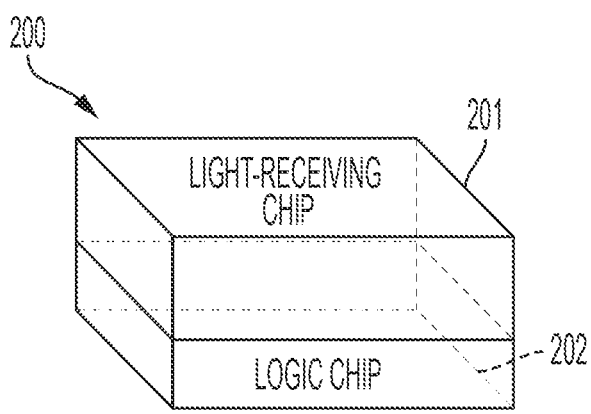
FIG. 2 is a view illustrating a lamination structure example of a solid-state imaging device according to in accordance with embodiments of the present disclosure.

FIG. 2 is a view illustrating a lamination structure example of a solid-state imaging device 200 in accordance with at least some embodiments of the present disclosure. As illustrated in FIG. 2, the solid-state imaging device 200 can have a structure in which a light-receiving chip 201 and a logic chip 202 are vertically laminated. In joining of the light-receiving chip 201 and the logic chip 202, for example, so-called direct joining in which joining surfaces of the chips are planarized, and the chips are laminated with an inter-electron force can be used. However, there is no limitation thereto, and for example, so-called Cu—Cu joining in which copper (Cu) electrode pads formed on joining surfaces are bonded, bump joining, and the like can also be used.

In addition, the light-receiving chip 201 and the logic chip 202 are electrically connected to each other, for example, through a connection portion such as a through-silicon via (TSV) that penetrates through a semiconductor substrate. In the connection using the TSV, for example, a so-called twin TSV method in which two TSVs including a TSV that is formed in the light-receiving chip 201 and a TSV that is formed from the light-receiving chip 201 to the logic chip 202 are connected to each other on chip external surfaces, a so-called shared TSV method in which the light-receiving chip 201 and the logic chip 202 are connected with a TSV that penetrates through both the chips, and the like can be employed.

However, in the case of using the Cu—Cu joining or the bump joining in the joining of the light-receiving chip 201 and the logic chip 202, both the light-receiving chip 201 and the logic chip 202 are electrically connected to each other through a Cu—Cu joint or a bump joint.

Figure 3:
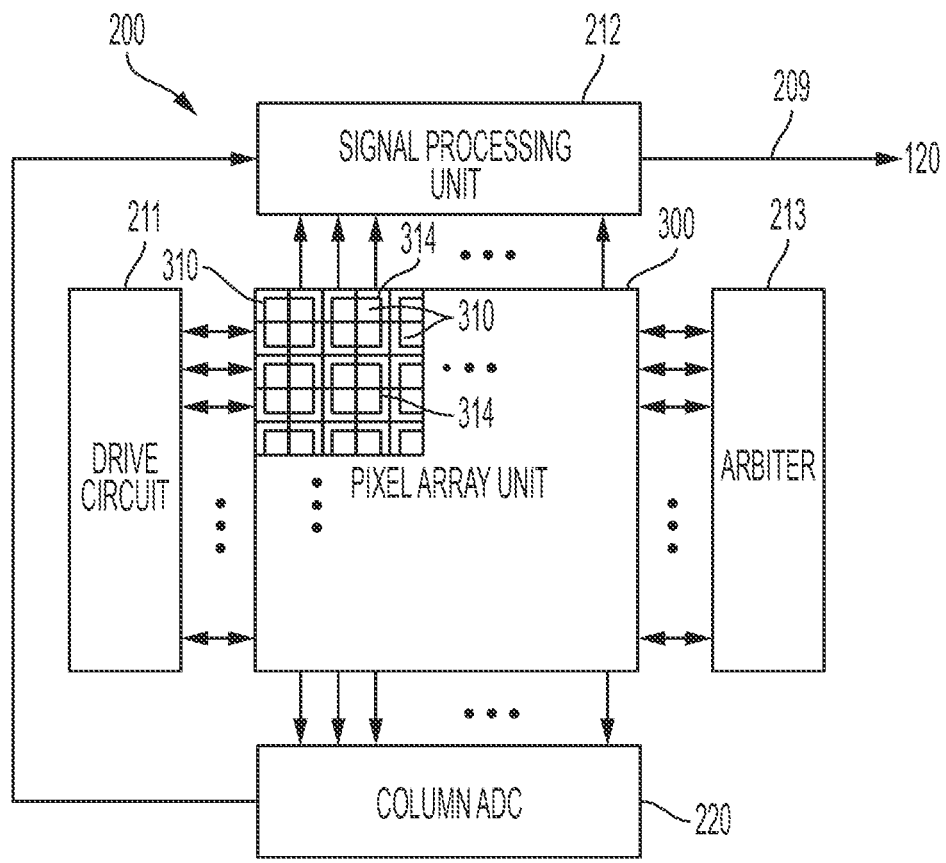
FIG. 3 is a block diagram illustrating a functional configuration example of a solid-state imaging device in accordance with embodiments of the present disclosure.

FIG. 3 is a block diagram illustrating a functional configuration example of the solid-state imaging device according to at least some embodiments of the present disclosure. As illustrated in FIG. 3, the solid-state imaging device 200 includes a drive circuit 211, a signal processing unit 212, an arbiter 213, a column ADC 220, and a pixel array unit 300.

A plurality of unit cells or pixels 310, also referred to herein simply as pixels 310, are arranged in the pixel array unit 300 in a two-dimensional lattice shape. Details of the unit pixels 310 will be described later. For example, each of the unit pixels 310 includes a photoelectric conversion element such as a photodiode, and a circuit that generates a pixel signal of a voltage value corresponding to the amount of charges generated in the photoelectric conversion element, hereinafter, referred to as a pixel circuit. Moreover, as discussed in greater detail herein, the pixel circuit can include a first or imaging signal generation circuit, and a second or address event detection readout circuit. Here, each photoelectric conversion element is associated with a pixel circuit provided only for that photoelectric conversion element. That is, pixel circuits are not shared by multiple photoelectric conversion elements.

The plurality of unit pixels 310 are arranged in the pixel array unit 300 in a two-dimensional lattice shape. The plurality of unit pixels 310 may be grouped into a plurality of pixel blocks or groups, each including a predetermined number of unit pixels. Hereinafter, an assembly of unit pixels which are arranged in a horizontal direction is referred to as "row", and an assembly of unit pixels which are arranged in a direction orthogonal to the row is referred to as "column".

Each of the unit pixels 310 generates charges corresponding to an amount of light received at the respective photoelectric conversion element. In addition, the unit pixels 310 can be operated to detect the existence or nonexistence of address event ignition on the basis of whether or not a value of a current (hereinafter, referred to as a photocurrent) produced by charges generated in the photoelectric conversion element or a variation amount thereof exceeds a predetermined threshold value. In addition, when the address event is ignited, a request for reading out a pixel signal of a voltage value corresponding to the light-reception amount of the photoelectric conversion element is output to the arbiter 213.

The drive circuit 211 drives each of the unit pixels 310, and allows each of the unit pixels 310 to output a pixel signal to the column ADC 220.

The arbiter 213 arbitrates requests from the unit pixels 310, and transmits a predetermined response to the unit pixel 310 which issues the request on the basis of the arbitration result. The unit pixel 310 which receives the response supplies a detection signal indicating the existence or nonexistence of the address event ignition (hereinafter, simply referred to as "address event detection signal") to the drive circuit 211 and the signal processing unit 212.

For every unit pixel 310 column, the column ADC 220 converts an analog pixel signal from the column into a digital signal. In addition, the column ADC 220 supplies a digital signal generated through the conversion to the signal processing unit 212.

The signal processing unit 212 executes predetermined signal processing such as correlated double sampling (CDS) processing (noise removal) and white balance adjustment with respect to the digital signal transmitted from the column ADC 220. In addition, the signal processing unit 212 supplies a signal processing result and an address event detection signal to the recording unit 120 through the signal line 209.

The unit pixels 310 within the pixel array unit 300 may be disposed in pixel groups 314. In the configuration illustrated in FIG. 3, for example, the pixel array unit 300 is constituted by pixel groups 314 that include an assembly of unit pixels 310 that receive wavelength components necessary to reconstruct a color. For example, in the case of reconstructing a color on the basis of three primary colors of RGB, in the pixel array unit 300, a unit pixel 310 that receives light of a red (R) color, a unit pixel 310 that receives light of a green (G) color, and a unit pixel 310 that receives light of a blue (B) color are arranged in groups 314a according to a predetermined color filter array.

Examples of the color filter array configurations include various arrays or pixel groups such as a Bayer array of 2×2 pixels, a color filter array of 3×3 pixels which is employed in an X-Trans (registered trademark) CMOS sensor (hereinafter, also referred to as "X-Trans (registered trademark) type array"), a Quad Bayer array of 4×4 pixels (also referred to as "Quadra array"), and a color filter of 4×4 pixels in which a white RGB color filter is combined to the Bayer array (hereinafter, also referred to as "white RGB array"). Here, in the following description, a case where the Bayer array is employed as the color filter array will be exemplified.

Figure 4A:
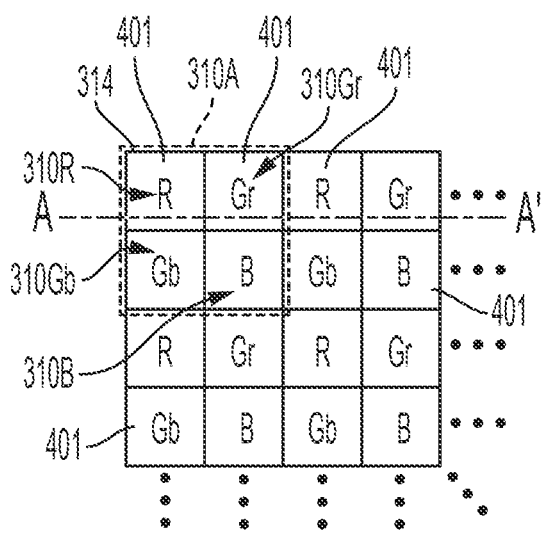
FIG. 4A is a schematic view illustrating an array example of unit pixels in accordance with embodiments of the present disclosure in a case of employing a Bayer array in a color filter array.

FIG. 4A is a schematic view illustrating an array example of unit pixels 310 in the case of employing pixel groups 314 with an arrangement of unit pixels 310 and associated color filters in the color filter array configured to form a plurality of Bayer arrays 310A. As illustrated in FIG. 4, in the case of employing the Bayer array as the color filter array configuration, in the pixel array unit 300, a basic pattern 310A including a total of four unit pixels 310 of 2×2 pixels is repetitively arranged in a column direction and a row direction. For example, the basic pattern 310A is constituted by a unit pixel 310R including a color filter 401 of a red (R) color, a unit pixel 310Gr including a color filter 401 of a green (Gr) color, a unit pixel 310Gb including a color filter 401 of a green (Gb) color, and a unit pixel 310B including a color filter 401 of a blue (B) color.

Figure 4B:
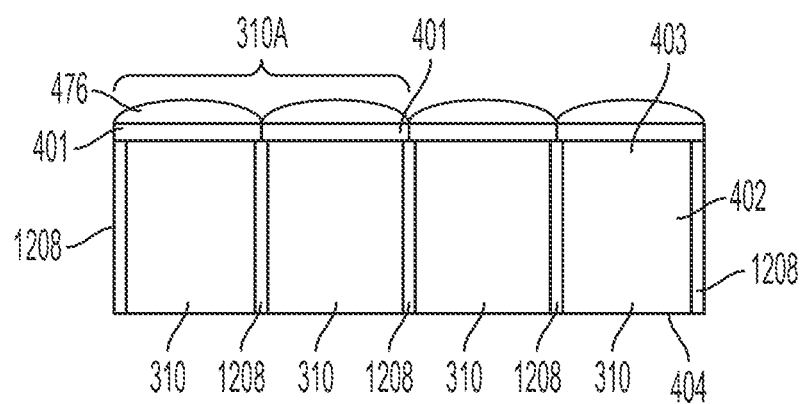
FIG. 4B is a cross-section of the array of unit pixels of FIG. 4A.

FIG. 4B depicts a cross-section of the example of unit pixels 310 of FIG. 4A taken along line A-A'. As shown, the unit pixels 310 formed in a substrate 402 that can be included as part of the light receiving chip 201. In addition, and as discussed further elsewhere herein, each unit pixel is bordered by isolation structure 1208. The isolation structure 1208 can be in the form of a full thickness dielectric trench (RFTI) structure or set of structures that extends through the entire thickness of the substrate 402, from a light incident surface 403 to an opposite surface 404 of the substrate 402. In addition, each unit pixel can be associated with an on-chip lens 476. Alternatively or in addition, an FFTI structure or set of structures can be provided for isolation between adjacent unit pixels.

Figure 5:
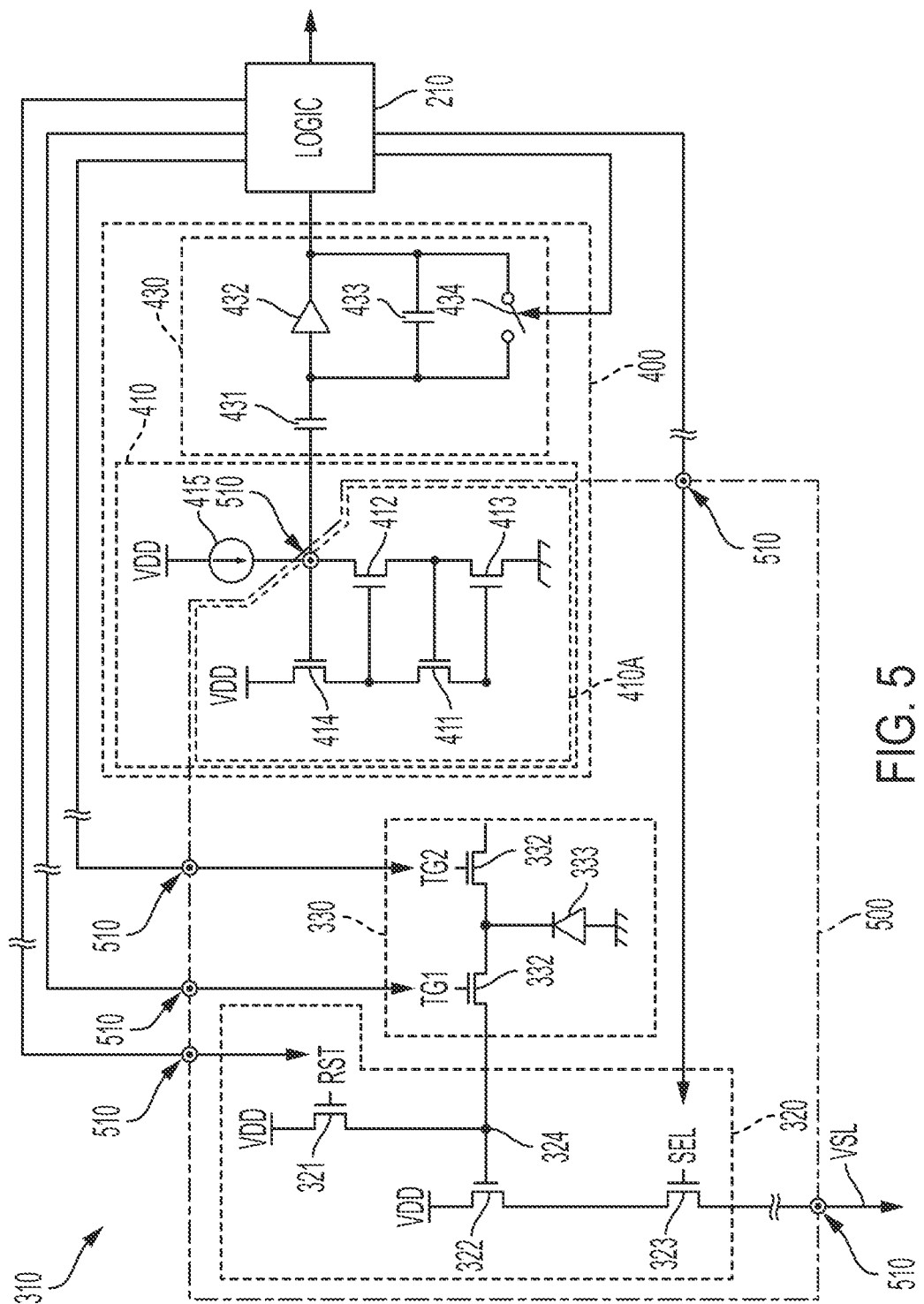
FIG. 5 is a circuit diagram illustrating a schematic configuration example of a unit pixel in accordance with embodiments of the present disclosure.

Next, a configuration example of a unit pixel 310 will be described. FIG. 5 is a circuit diagram illustrating a schematic configuration example of the unit pixel 310 according to at least some embodiments of the present disclosure. As illustrated in FIG. 5, the unit pixel 310 includes, for example, a pixel imaging signal generation unit (or readout circuit) 320, a light-receiving unit 330, and an address event detection unit (or readout circuit) 400. According to at least one example embodiment, the readout circuit 400 is configured to control the readout circuit 320 based on charge generated by a photoelectric conversion element (or photoelectric conversion region) 333. Furthermore, the logic circuit 210 in FIG. 5 is a logic circuit including, for example, the drive circuit 211, the signal processing unit 212, and the arbiter 213 in FIG. 3.

For example, the light-receiving unit 330 includes a first or imaging transmission transistor or gate (first transistor) 331, a second or address event detection transmission transistor or gate (second transistor) 332, and a photoelectric conversion element 333. A first transmission signal TG1 transmitted from the drive circuit 211 is selectively supplied to a gate of the first transmission transistor 331 of the light-receiving unit 330, and a second transmission signal TG2 transmitted from the drive circuit 211 is selectively supplied to a gate of the second transmission transistor 332. An output through the first transmission transistor 331 of the light-receiving unit 330 is connected to the pixel imaging signal generation unit 320, and an output through the second transmission transistor 332 is connected to the address event detection unit 400.

For example, the pixel imaging signal generation unit 320 includes a reset transistor (third transistor) 321, an amplification transistor (fourth transistor) 322, a selection transistor (fifth transistor) 323, and a floating diffusion layer (FD) 324.

In accordance with at least some embodiments of the present disclosure, the first transmission transistor 331 and the second transmission transistor 332 of the light-receiving unit 330 are constituted, for example, by using an N-type metal-oxide-semiconductor (MOS) transistor (hereinafter, simply referred to as "NMOS transistor"). Similarly, the reset transistor 321, the amplification transistor 322, and the selection transistor 323 of the pixel imaging signal generation unit 320 are each constituted, for example, by using the NMOS transistor.

For example, the address event detection unit 400 includes a current-voltage conversion unit 410 and a subtractor 430. However, the address event detection unit 400 is further provided with a buffer, a quantizer, and a transmission unit. Details of the address event detection unit 400 will be described in the following description by using FIG. 6 and the like.

In the illustrated configuration, the photoelectric conversion element 333 of the light-receiving unit 330 photoelectrically converts incident light to generate a charge. The first transmission transistor 331 transmits a charge generated in the photoelectric conversion element 333 to the floating diffusion layer 324 in accordance with the first transmission signal TG1. The second transmission transistor 332 supplies an electric signal (photocurrent) based on the charge generated in the photoelectric conversion element 333 to the address event detection unit 400 in accordance with the control signal TG2.

The floating diffusion layer 324 accumulates charges transmitted from the photoelectric conversion element 333 through the first transmission transistor 331. The reset transistor 321 discharges (initializes) the charges accumulated in the floating diffusion layer 324 in accordance with a reset signal transmitted from the drive circuit 211. The amplification transistor 322 allows a pixel signal of a voltage value corresponding to a charge amount of charges accumulated in the floating diffusion layer 324 to appear in a vertical signal line VSL. The selection transistor 323 switches a connection between the amplification transistor 322 and the vertical signal line VSL in accordance with a selection signal SEL transmitted from the drive circuit 211. Furthermore, the analog pixel signal that appears in the vertical signal line VSL is read out by the column ADC 220, and is converted into a digital pixel signal.

When an instruction for address event detection initiation is given by the control unit 130, the drive circuit 211 in the logic circuit 210 outputs the control signal for setting the second transmission transistor 332 of the light-receiving unit 330 in the pixel array unit 300 to an ON-state. With this arrangement, a photocurrent generated in the photoelectric conversion element 333 of the light-receiving unit 330 is supplied to the address event detection unit 400 of each unit pixel 310 through the second transmission transistor 332.

When detecting address event ignition on the basis of the photocurrent from the light-receiving unit 330, the address event detection unit 400 of each unit pixel 310 outputs a request to the arbiter 213. With respect to this, the arbiter 213 arbitrates the request transmitted from each of the unit pixels 310, and transmits a predetermined response to the unit pixel 310 that issues the request on the basis of the arbitration result. The unit pixel 310 that receives the response supplies a detection signal indicating the existence or nonexistence of the address event ignition (hereinafter, referred to as "address event detection signal") to the drive circuit 211 and the signal processing unit 212 in the logic circuit 210.

The drive circuit 211 sets the second transmission transistor 332 in the unit pixel 310 that is a supply source of the address event detection signal to an OFF-state. With this arrangement, a supply of the photocurrent from the light-receiving unit 330 to the address event detection unit 400 in the unit pixel 310 is stopped.

Next, the drive circuit 211 sets the first transmission transistor 331 in the light-receiving unit 330 of the unit pixel 310 to an ON-state by the transmission signal TG. With this arrangement, a charge generated in the photoelectric conversion element 333 of the light-receiving unit 330 is transmitted to the floating diffusion layer 324 through the first transmission transistor 331. In addition, a pixel signal of a voltage value corresponding to a charge amount of charges accumulated in the floating diffusion layer 324 appears in the vertical signal line VSL that is connected to the selection transistor 323 of the pixel imaging signal generation unit 320.

As described above, in the solid-state imaging device 200, a pixel signal SIG is output from the unit pixel 310 in which the address event ignition is detected to the column ADC 220.

Furthermore, for example, the light-receiving unit 330, the pixel imaging signal generation unit 320, and two log (LG) transistors (sixth and seventh transistors) 411 and 414 and two amplification transistors (eighth and ninth transistors) 412 and 413 in the current-voltage conversion unit 410 of the address event detection unit 400 are disposed, for example, in the light-receiving chip 201 illustrated in FIG. 2, and other components can be disposed, for example, in the logic chip 202 that is joined to the light-receiving chip 201 through the Cu—Cu joining. Therefore, in the following description, in the unit pixel 310, configurations which are disposed in the light-receiving chip 201 are referred to as "upper layer circuit".

Figure 6:
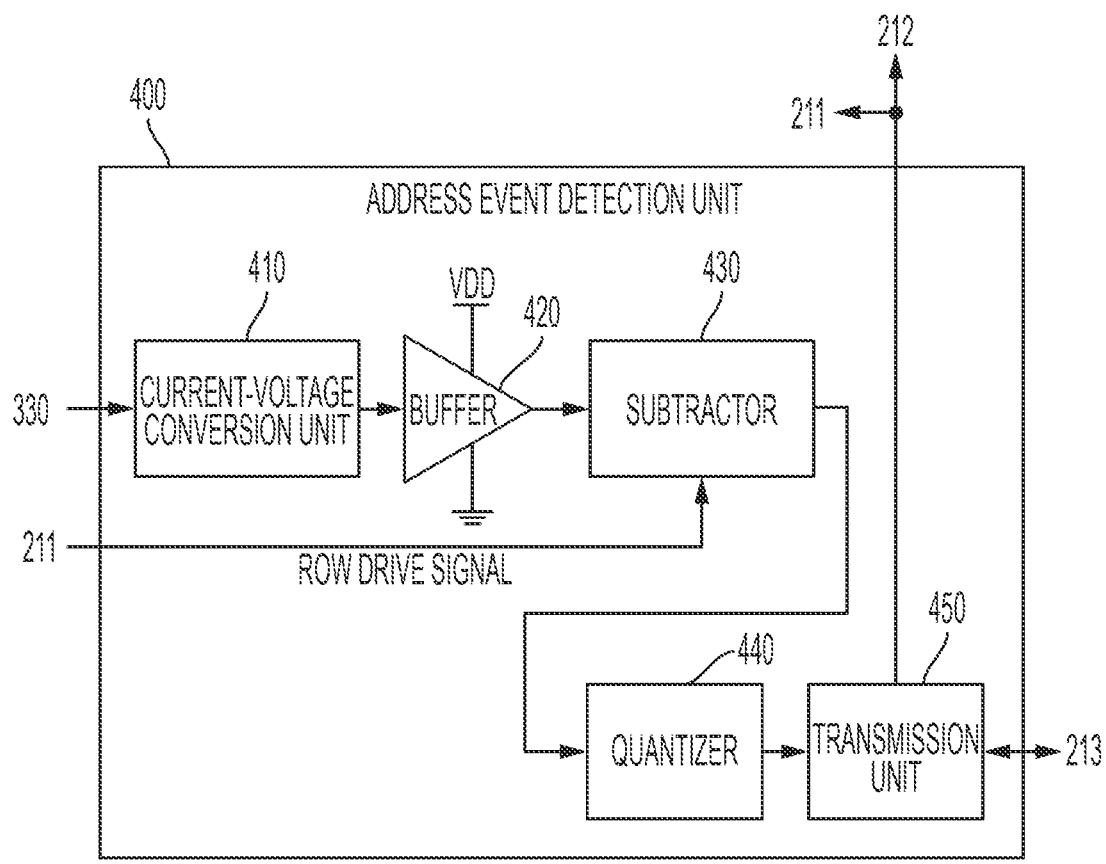
FIG. 6 is a block diagram illustrating a schematic configuration example of an address event detection unit in accordance with embodiments of the present disclosure.

FIG. 6 is a block diagram illustrating a schematic configuration example of the address event detection unit 400 according to at least some embodiments of the present disclosure. As illustrated in FIG. 6, the address event detection unit 400 includes a current-voltage conversion unit 410, a buffer 420, a subtractor 430, a quantizer 440, and a transmission unit 450.

The current-voltage conversion unit 410 converts the photocurrent from the light-receiving unit 330 into a voltage signal in a logarithm thereof, and supplies the voltage signal generated through the conversion to the buffer 420.

The buffer 420 corrects the voltage signal transmitted from the current-voltage conversion unit 410, and outputs a voltage signal after correction to the subtractor 430.

The subtractor 430 lowers a voltage level of the voltage signal transmitted from the buffer 420 in accordance with a row drive signal transmitted from the drive circuit 211 and, supplies the lowered voltage signal to the quantizer 440.

The quantizer 440 quantizes the voltage signal transmitted from the subtractor 430 into a digital signal, and outputs the digital signal generated through the quantization to the transmission unit 450 as a detection signal.

The transmission unit 450 transmits the detection signal transmitted from the quantizer 440 to the signal processing unit 212 and the like. For example, when address event ignition is detected, the transmission unit 450 supplies a request for transmission of an address event detection signal from the transmission unit 450 to the drive circuit 211 and the signal processing unit 212 to the arbiter 213. In addition, when receiving a response with respect to the request from the arbiter 213, the transmission unit 450 supplies the detection signal to the drive circuit 211 and the signal processing unit 212.

For example, the current-voltage conversion unit 410 in the configuration illustrated in FIG. 6 includes the two LG transistors 411 and 414, the two amplification transistors 412 and 413, and a constant-current circuit 415 as illustrated in FIG. 5.

For example, a source of the LG transistor 411 and a gate of the amplification transistor 413 are connected to a drain of the second transmission transistor 332 of the light-receiving unit 330. In addition, for example, a drain of the LG transistor 411 is connected to a source of the LG transistor 414 and a gate of the amplification transistor 412. For example, a drain of the LG transistor 414 is connected to a power supply terminal VDD.

In addition, for example, a source of the amplification transistor 413 is grounded, and a drain thereof is connected to a gate of the LG transistor 411 and a source of the amplification transistor 412. For example, a drain of the amplification transistor 412 is connected to a power supply terminal VDD through the constant-current circuit 415. For example, the constant-current circuit 415 is constituted by a load MOS transistor such as a p-type MOS transistor.

In this connection relationship, a loop-shaped source follower circuit is constructed. With this arrangement, a photocurrent from the light-receiving unit 330 is converted into a voltage signal in a logarithmic value corresponding to a charge amount thereof. Furthermore, the LG transistors 411 and 414, and the amplification transistors 412 and 413 may be each constituted, for example, by an NMOS transistor.

Figure 7:
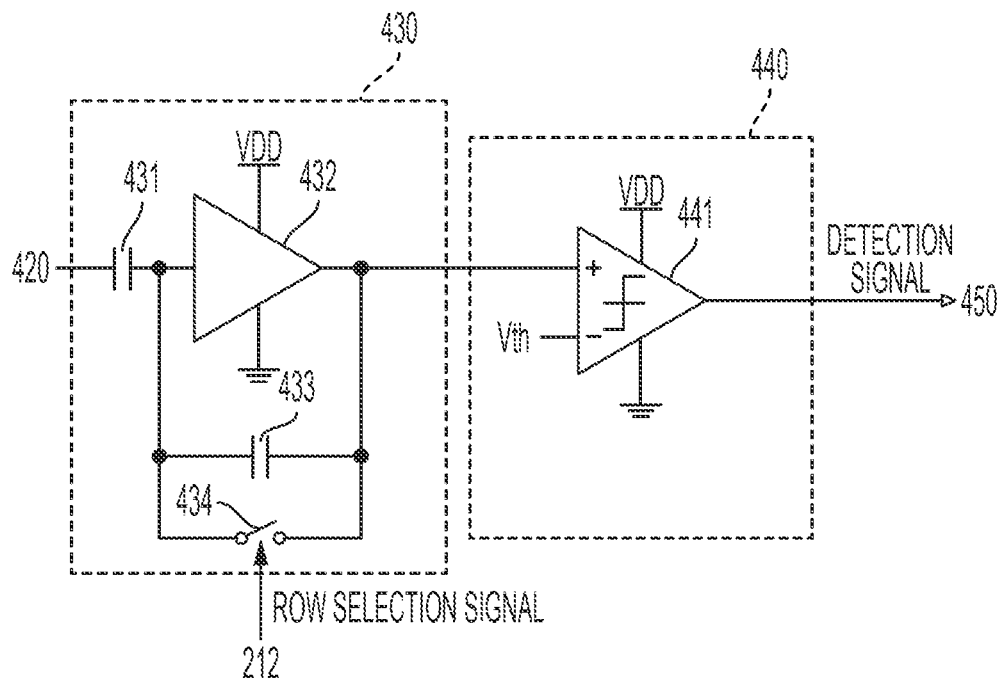
FIG. 7 is a circuit diagram illustrating a schematic configuration example of a subtractor and a quantizer in accordance with embodiments of the present disclosure.

FIG. 7 is a circuit diagram illustrating a schematic configuration example of the subtractor and the quantizer according to at least some embodiments of the present disclosure. As illustrated in FIG. 7, the subtractor 430 includes capacitors 431 and 433, an inverter 432, and a switch 434. In addition, the quantizer 440 includes a comparator 441.

One end of the capacitor 431 is connected to an output terminal of the buffer 420, and the other end is connected to an input terminal of the inverter 432. The capacitor 433 is connected to the inverter 432 in parallel. The switch 434 opens or closes a route connecting both ends of the capacitor 433 in accordance with a row drive signal.

The inverter 432 inverts a voltage signal that is input through the capacitor 431. The inverter 432 outputs an inverted signal to a non-inverting input terminal (+) of the comparator 441.

When the switch 434 is turned on, a voltage signal Vinit is input to a buffer 420 side of the capacitor 431. In addition, the opposite side becomes a virtual ground terminal. A potential of the virtual ground terminal is set to zero for convenience. At this time, when a capacity of the capacitor 431 is set as C1, a potential Qinit that is accumulated in the capacitor 431 is expressed by the following Expression (1). On the other hand, both ends of the capacitor 433 are short-circuited, and thus an accumulated charge thereof becomes zero.

$$Qinit = C1 \times Vinit \qquad (1)$$

Next, when considering a case where the switch 434 is turned off, and a voltage of the capacitor 431 on the buffer 420 side varies and reaches Vafter, a charge Qafter accumulated in the capacitor 431 is expressed by the following Expression (2).

$$Qafter = C1 \times Vafter \qquad (2)$$

On the other hand, when an output voltage is set as Vout, a charge Q2 accumulated in the capacitor 433 is expressed by the following Expression (3).

$$Q2 = -C2 \times Vout \qquad (3)$$

At this time, a total charge amount of the capacitors 431 and 433 does not vary, and thus the following Expression (4) is established.

$$Q\text{init} = Q\text{after} + Q2 \quad (4)$$

When Expression (1) to Expression (3) are substituted for Expression (4), the following Expression (5) is obtained.

$$V\text{out} = -(C1/C2) \times (V\text{after} - V\text{init}) \quad (5)$$

Expression (5) represents a subtraction operation of a voltage signal, and a gain of the subtraction result becomes C1/C2. Typically, it is desired to maximize (or alternatively, improve) the gain, and thus it is preferable to make a design so that C1 becomes large and C2 becomes small. On the other hand, when C2 is excessively small, kTC noise increases, and thus there is a concern that noise characteristics deteriorate. Accordingly, a reduction in the capacity of C2 is limited to a range capable of permitting noise. In addition, since the address event detection unit 400 including the subtractor 430 is mounted for every unit pixel 310, a restriction on an area is present in capacities C1 and C2. Values of the capacities C1 and C2 are determined in consideration of the restriction.

The comparator 441 compares a voltage signal transmitted from the subtractor 430 and a predetermined threshold voltage Vth that is applied to an inverting input terminal (−). The comparator 441 outputs a signal indicating the comparison result to the transmission unit 450 as a detection signal.

In addition, when a conversion gain by the current-voltage conversion unit 410 is set as CGlog, and a gain of the buffer 420 is set to "1", a gain A of the entirety of the address event detection unit 400 is expressed by the following Expression (6).

Mathematical Formula 1

$$A = \frac{CG_{log} \cdot C1}{C2} \sum_{n=1}^{N} i_{photo\_n} \quad (6)$$

In Expression (6), $i_{photo\_n}$ represents a photocurrent of an nth unit pixel 310, and a unit thereof is, for example, an ampere (A). N represents the number of the unit pixels 310 in a pixel block, and is "1" in this embodiment.

Figure 8:
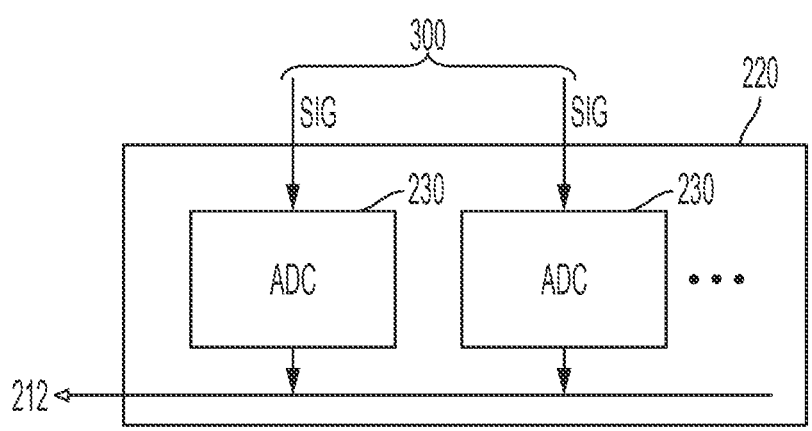
FIG. 8 is a block diagram illustrating a schematic configuration example of a column ADC in accordance with embodiments of the present disclosure.

FIG. 8 is a block diagram illustrating a schematic configuration example of the column ADC according to at least some embodiments of the present disclosure. The column ADC 220 includes a plurality of ADCs 230 which are provided for every column of the unit pixels 310.

Each of the ADCs 230 converts an analog pixel signal that appears in the vertical signal line VSL into a digital signal. For example, the pixel signal is converted into a digital signal in which a bit length is greater than that of a detection signal. For example, when the detection signal is set to two bits, the pixel signal is converted into a digital signal of three or greater bits (16 bits and the like). The ADC 230 supplies a generated digital signal to the signal processing unit 212.

Next, an operation of the solid-state imaging device 200 according to at least embodiments of the present disclosure will be described in detail with reference to the accompanying drawings.

Figure 9:
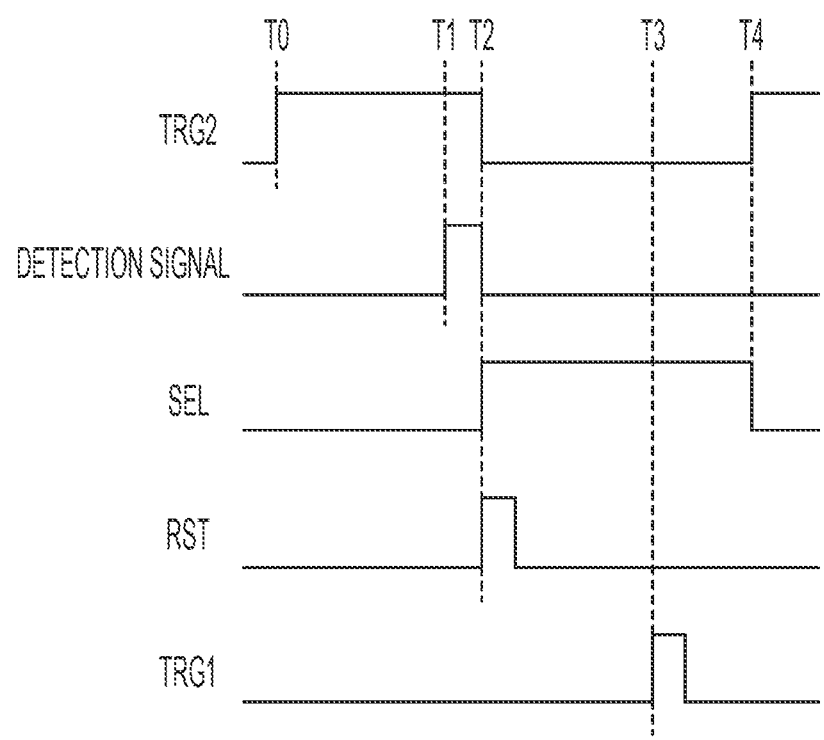
FIG. 9 is a timing chart illustrating an example of an operation of a solid-state imaging device in accordance with embodiments of the present disclosure.

First, an example of the operation of the solid-state imaging device 200 will be described by using a timing chart. FIG. 9 is a timing chart illustrating an example of the operation of the solid-state imaging device according to the first embodiment.

As illustrated in FIG. 9, at a timing T0, when an instruction for address event detection initiation is given by the control unit 130, the drive circuit 211 raises the control signal TG2 applied to the gate of the second transmission transistor 332 of all of the light-receiving units 330 in the pixel array unit 300 to a high level. With this arrangement, a plurality of the second transmission transistors 332 of all of the light-receiving units 330 enter an ON-state, and a photocurrent based on a charge generated in the photoelectric conversion element 333 of each of the light-receiving units 330 is supplied from each the light-receiving units 330 to each of a plurality of the address event detection units 400.

In addition, in a period in which the control signal OFG is in a high level, all of the transmission signals TG1 applied to the gate of the first transmission transistor 331 in each of the light-receiving units 330 are maintained in a low level. Accordingly, in this period, a plurality of the transmission transistors 331 in all of the light-receiving units 330 are in an OFF-state.

Next, a case where the address event detection unit 400 of an arbitrary unit pixel 310 detects address event ignition in a period in which the control signal TG2 is in a high level will be assumed. In this case, the address event detection unit 400 that detects the address event ignition transmits a request to the arbiter 213. With respect to this, the arbiter 213 arbitrates the request, and returns a response for the request to the address event detection unit 400 that issues the request.

The address event detection unit 400 that receives the response raises a detection signal that is input to the drive circuit 211 and the signal processing unit 212 to a high level, for example, in a period of a timing T1 to a timing T2. Furthermore, in this description, it is assumed that the detection signal is a one-bit signal The drive circuit 211 to which a high-level detection signal is input from the address event detection unit 400 at the timing T1 lowers all control signals OFG to a low level at a subsequent timing T2. With this arrangement, supply of a photocurrent from all of the light-receiving units 330 of the pixel array unit 300 to the address event detection unit 400 is stopped.

In addition, at the timing T2, the drive circuit 211 raises a selection signal SEL that is applied to a gate of the selection transistor 323 in the pixel imaging signal generation unit 320 of the unit pixel 310 in which the address event ignition is detected (hereinafter, referred to as "reading-out target unit pixel") to a high level, and raises a reset signal RST that is applied to a gate of the reset transistor 321 of the same pixel imaging signal generation unit 320 to a high level for a constant pulse period, thereby discharging (initializing) charges accumulated in the floating diffusion layer 324 of the pixel imaging signal generation unit 320. In this manner, a voltage, which appears in the vertical signal line VSL in a state in which the floating diffusion layer 324 is initialized, is read out by the ADC 230 connected to the vertical signal line VSL in the column ADC 220 as a reset-level pixel signal (hereinafter, simply referred to as "reset level"), and is converted into a digital signal.

Next, at a timing T3 after reading out the reset level, the drive circuit 211 applies a transmission signal TG of a constant pulse period to the gate of the first transmission transistor 331 of the light-receiving unit 330 in the reading-out target unit pixel 310. With this arrangement, a charge generated in the photoelectric conversion element 333 of the light-receiving unit 330 is transmitted to the floating diffusion layer 324 in the pixel imaging signal generation unit 320, and a voltage corresponding to charges accumulated in the floating diffusion layer 324 appears in the vertical signal line VSL. In this manner, the voltage that appears in the vertical signal line VSL is read out by the ADC 230 connected to the vertical signal line VSL in the column ADC 220 as a signal-level pixel signal of the light-receiving unit 330 (hereinafter, simply referred to as "signal level") and is converted into a digital value.

The signal processing unit 212 executes CDS processing in which a difference between the reset level and the signal level which are read out as described above is obtained as a net pixel signal corresponding to a light-reception amount of the photoelectric conversion element 333.

Next, at a timing T4, the drive circuit 211 lowers the selection signal SEL that is applied to the gate of the selection transistor 323 in the pixel imaging signal generation readout circuit 320 of the reading-out target unit pixel 310 to a low level, and raises the control signal TG2 that is applied to the gate of the second transmission transistor 332 of all of the light-receiving units 330 in the pixel array unit 300 to a high level. With this arrangement, address event ignition detection in all of the light-receiving units 330 in the pixel array unit 300 is restarted.

Figure 10:
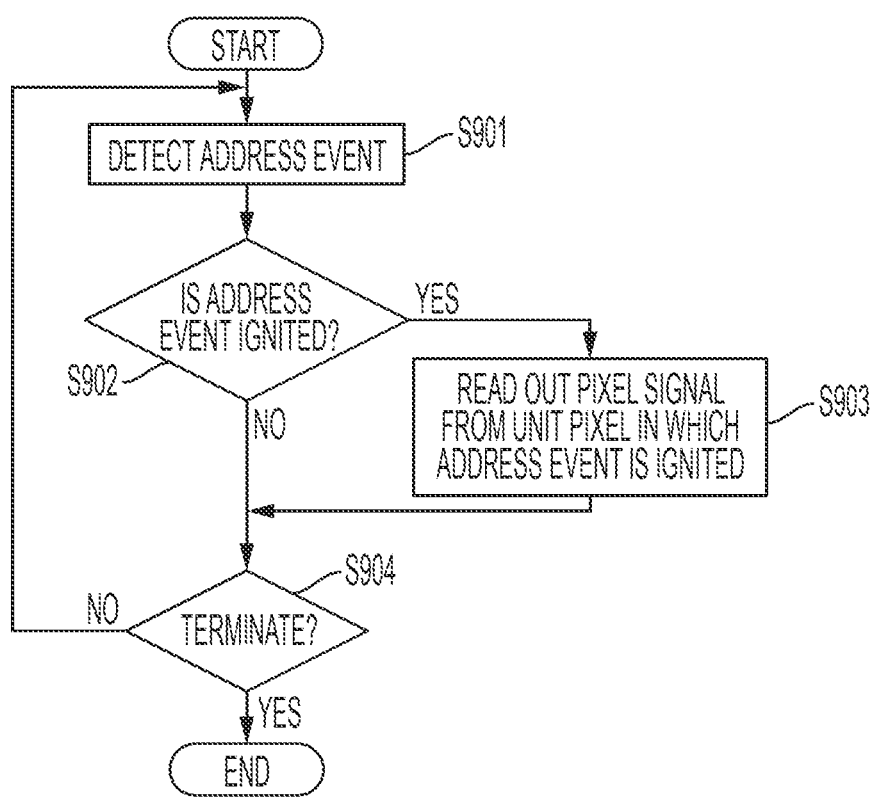
FIG. 10 is a flowchart illustrating an example of the operation of a solid-state imaging device in accordance with embodiments of the present disclosure.

Next, an example of the operation of the solid-state imaging device 200 will be described by using a flowchart. FIG. 10 is a flowchart illustrating an example of the operation of the solid-state imaging device according to at least some embodiments of the present disclosure. For example, this operation is initiated when a predetermined application for detecting an address event is executed.

As illustrated in FIG. 10, in this operation, first, each of the unit pixels 310 in the pixel array unit 300 detects the existence or nonexistence of address event ignition (step S901). In addition, the drive circuit 211 determines whether or not address event ignition is detected in any one of the unit pixels 310 (step S902).

In a case where the address event ignition is not detected (NO in step S902), this operation proceeds to step S904. On the other hand, in a case where the address event ignition is detected (YES in step S902), the drive circuit 211 executes reading-out of a pixel signal with respect to the unit pixel 310 in which the address event ignition is detected (step S903), and proceeds to step S904.

In step S904, it is determined whether or not to terminate this operation. In a case where this operation is not terminated (NO in step S904), this operation returns to step S901, and the subsequent operations are repeated. On the other hand, in a case where this operation is terminated (YES in step S904), this operation is terminated.

Figure 11:
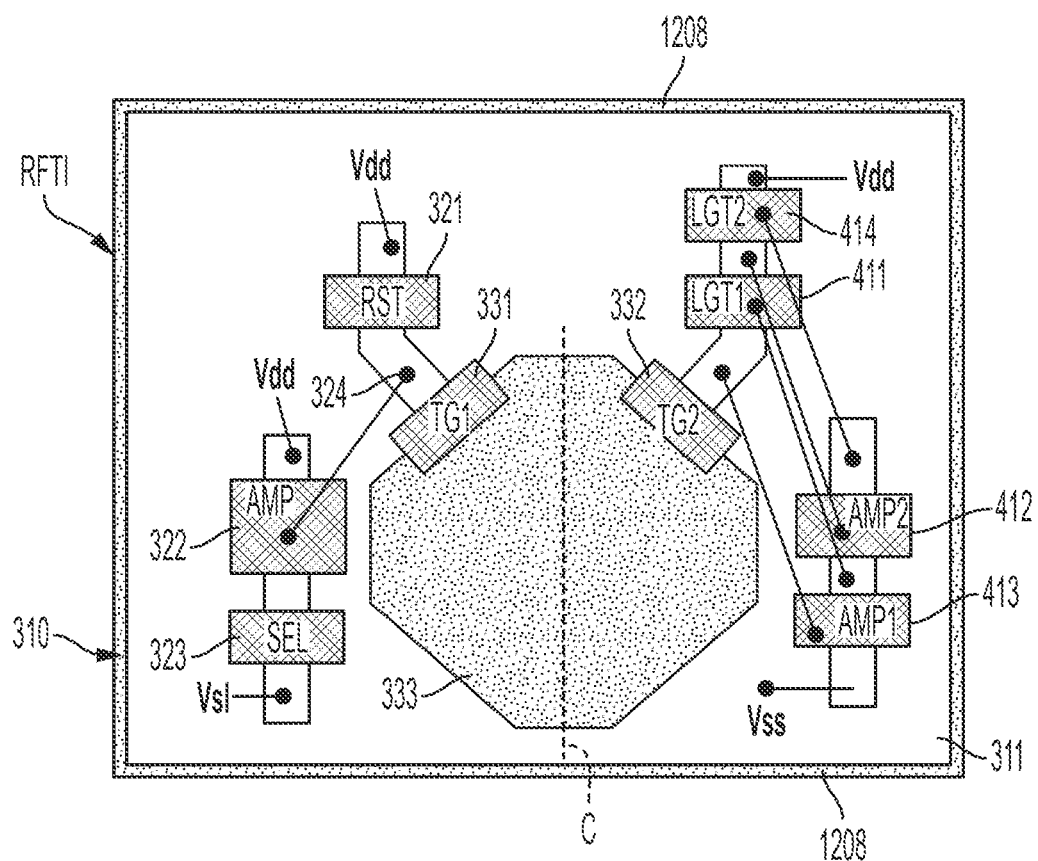
FIG. 11 is a plan view of a pixel configuration in accordance with a first exemplary embodiment of the present disclosure.
Figure 12:
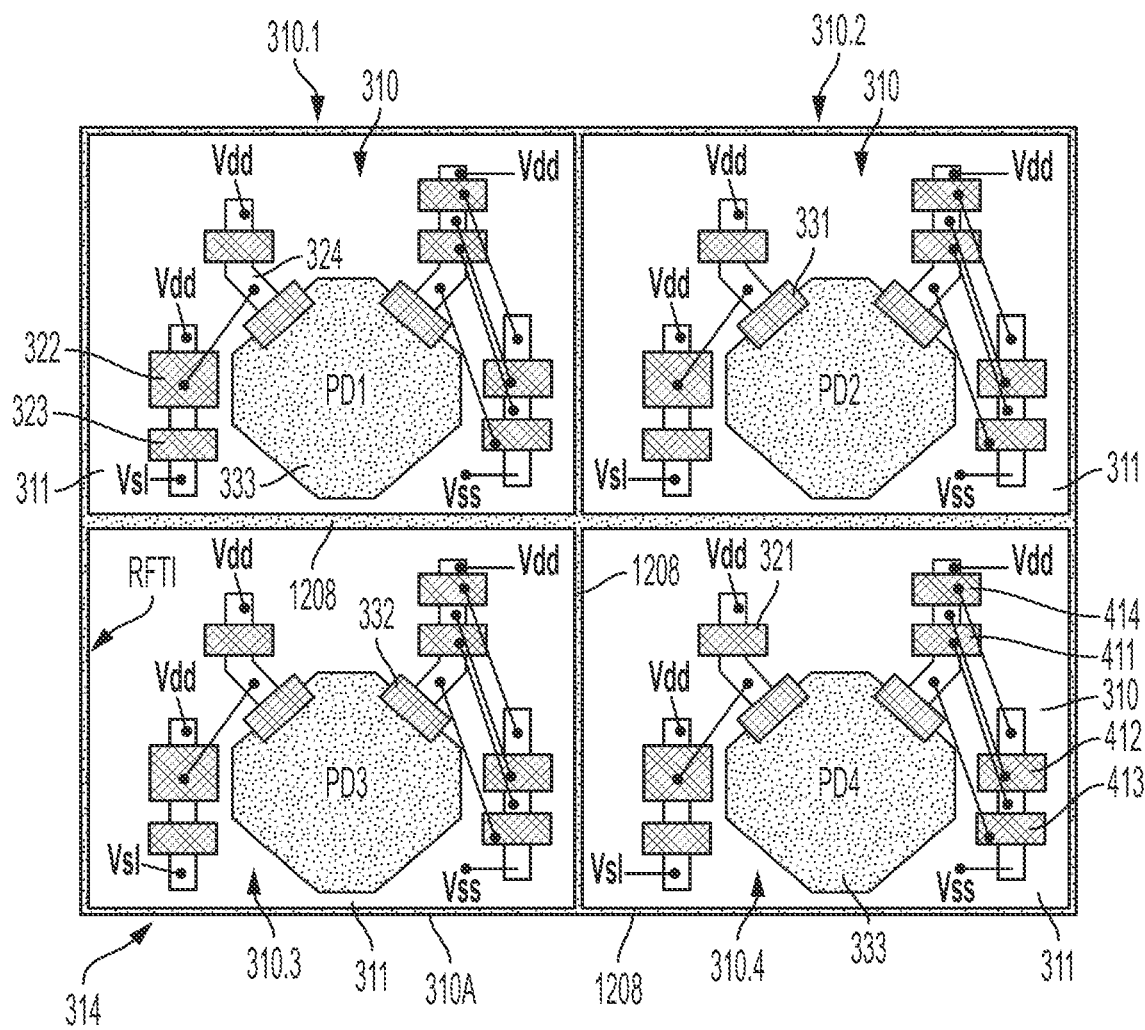
FIG. 12 is a plan view of a portion of a pixel array comprising a group of pixels configured as in the first exemplary embodiment.

FIG. 11 is a plan view of a pixel configuration in accordance with a first exemplary embodiment of the present disclosure, and FIG. 12 is a plan view of a portion of a pixel array comprising a group of pixels configured as in the first exemplary embodiment. More particularly, FIG. 11 is a top view illustrating a schematic configuration example of a unit pixel 310 according to the first exemplary embodiment. In this example, the photoelectric conversion element 333 of the unit pixel 310 has a hexagonal shape. In accordance with further embodiments of the present disclosure, the photoelectric conversion element 331 can have any other shape, including but not limited to rectangular, elliptical, or round. Also in this example, circuit elements associated with the pixel imaging signal generation unit or readout circuit 320 are located on a first side of a centerline C of the photoelectric conversion element 333, while circuit elements associated with the address event detection unit or readout circuit 400 are located on a second side of the centerline C of the photoelectric conversion element 333. The components of the unit pixel 310 are placed within a pixel area 311, in this example having a rectangular shape, though other shapes are possible, bordered by an isolation structure 1208.

In this second exemplary embodiment, the circuit elements of the pixel imaging signal readout circuit 320 of the unit pixel 310 located within the pixel area 311 include a reset transistor 321, a floating diffusion 324, amplification transistor 322, and a selection transistor 323. The circuit elements of the address event detection readout circuit 400 of the unit pixel 310 located within the pixel area 311 include first and second log transistors 411 and 414 and first and second amplification transistors 412 and 413. The pixel imaging signal readout circuit 320 is connected to the photoelectric conversion element 333 by a first transmission transistor 331, while the address event detection read out circuit 320 is connected to the photoelectric conversion element 333 by a second transmission transistor 332. The first and second transmission transistors 331 and 332 are also located within the pixel area 311.

Also in this example embodiment, the first transmission transistor 331 is formed along a portion of one side of the hexagonal photoelectric conversion element 333. Moreover, the first transmission transistor 331 is formed on the first side of the centerline C of the photoelectric conversion element 333. The second transmission transistor 332 is formed along a portion of another side of the hexagonal photoelectric conversion element 333. Moreover, the second transmission transistor 332 is formed on the second side of the centerline C of the photoelectric conversion element 333. As depicted in FIG. 11, the side or facet of the photoelectric conversion element 333 along which the first transmission transistor 331 is formed can be separated from the side or facet along which the second transmission transistor 332 is formed by another side or facet of the photoelectric conversion element. However, it should be appreciated that, with a hexagonal photoelectric conversion element 333, the minimum spacing of the transmission transistors 331 and 332 is any number of facets between 0 and 3 facets. In accordance with still other embodiments of the present disclosure, the first and second transmission transistors 331 and 332 can be formed on the same side or facet of the photoelectric conversion element 333.

FIG. 12 is a plan view of a portion of a pixel array unit 300 comprising a group 314 of unit pixels 310 that are each configured according to the first exemplary embodiment. More particularly, the unit pixels 310 of the pixel group 314 include a 2×2 subarray of first 310.1, second 310.2, third 310.3, and fourth 310.4 unit pixels 310. In accordance with at least some embodiments of the present disclosure, the group 314 of unit pixels 310 may be configured as a pixel group 314 configured in a pattern 310A that includes an assembly of unit pixels 310 that receive different wavelength components. As shown in FIG. 12, there is no sharing of the circuit elements shown as being included in each individual unit pixel 310. Instead, the isolation structures 1208 that are provided around each of the unit pixel areas 311 separate the unit pixels 310 from one another. As shown, when unit pixels 310 are aggregated into groups 314, isolation structures between neighboring unit pixels 310 can be shared such that the isolation structure 1208 that defines a side of a first unit pixel (e.g. unit pixel 310.1) can also define a side of an adjacent unit pixel (e.g. unit pixel 310.2). In accordance with embodiments of the present disclosure, the isolation structures 1208 may be in the form of full thickness dielectric trench isolation or simply full thickness trench isolation (RFTI) structures.

Figure 13:
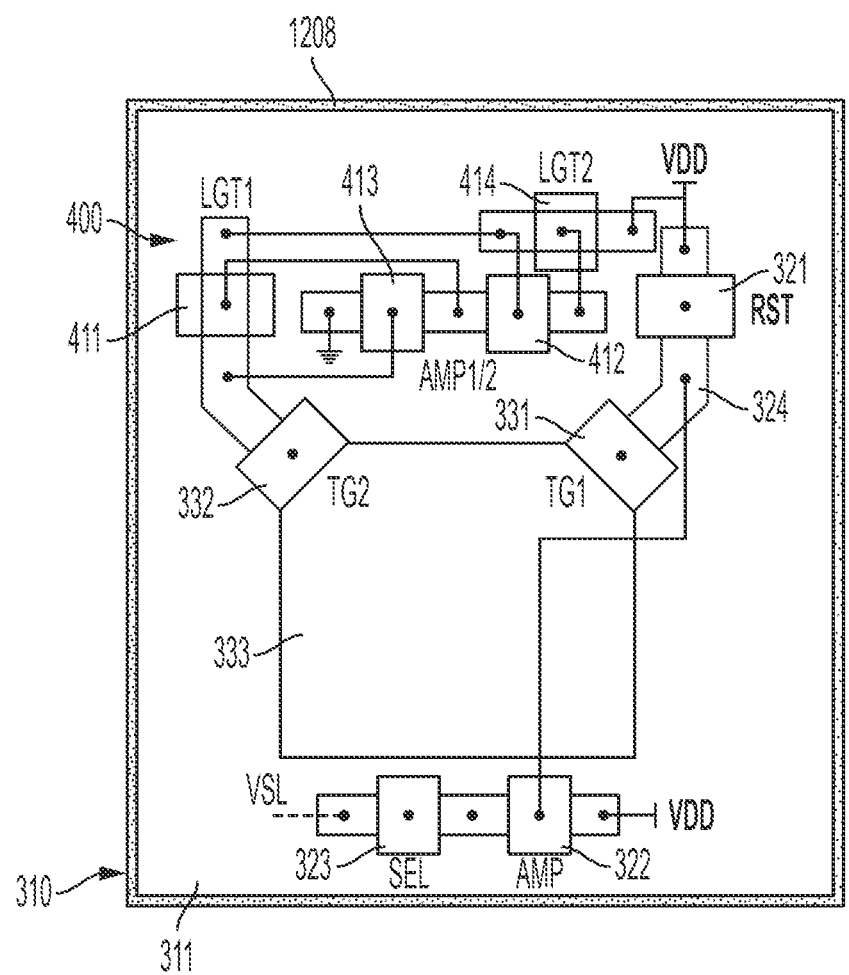
FIG. 13 is a plan view of a pixel configuration in accordance with a second exemplary embodiment of the present disclosure.
Figure 14:
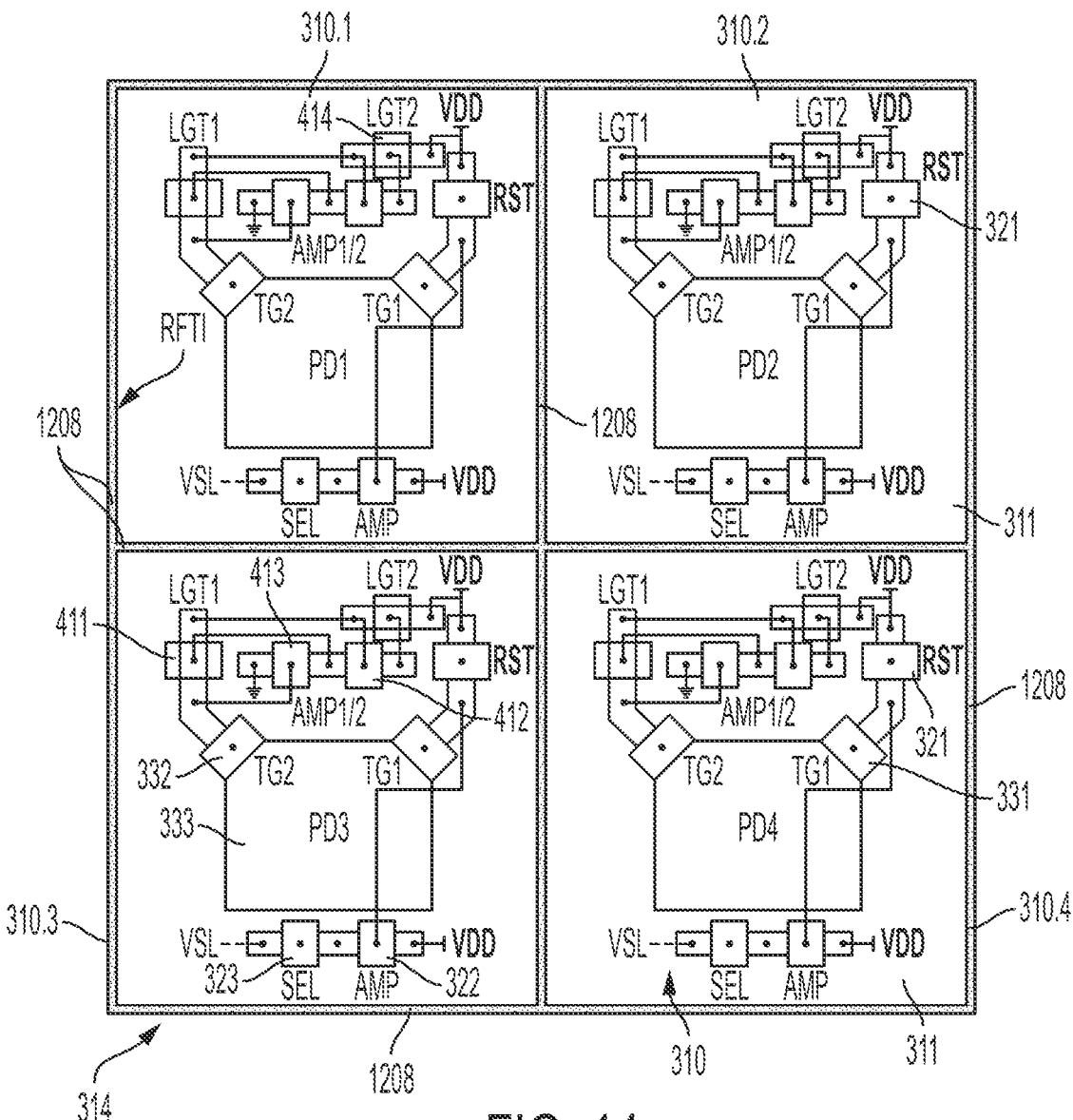
FIG. 14 is a plan view of a portion of a pixel array comprising a group of pixels configured as in the second exemplary embodiment.

FIG. 13 is a plan view of a pixel configuration in accordance with a second exemplary embodiment of the present disclosure, and FIG. 14 is a plan view of a portion of a pixel array comprising a group of pixels configured as in the second exemplary embodiment. More particularly, FIG. 13 is a top view illustrating a schematic configuration example of a unit pixel 310 according to the second exemplary embodiment. In this example, the photoelectric conversion element 333 of the unit pixel 310 has a generally rectangular shape. However, in accordance with further embodiments of the present disclosure, the photoelectric conversion element 331 can have any other shape, including but not limited to hexagonal, elliptical, or round. Also in this example, all of the circuit elements associated with the address event detection unit or readout circuit 400 are located adjacent one side (the top side in FIG. 13) of the photoelectric conversion element 333, while some of the circuit elements associated with the pixel imaging signal generation unit or readout circuit 320 are located adjacent the top side of the photoelectric conversion element 333, and other components of the pixel imaging signal generation readout circuit 320 are located adjacent the opposite side (the bottom side in FIG. 13) of the photoelectric conversion element 333. As used herein, terms such as "top" and "bottom" are used to describe the relative locations of components within a figure, and are not intended to necessarily imply absolute locations of those components. The components of the unit pixel 310 are placed within a pixel area 311 bordered by an isolation structure 1208. In this example the pixel area 311 has a rectangular shape, though other shapes are possible.

In this second example embodiment, the circuit elements of the pixel imaging signal readout circuit 320 of the unit pixel 310 located within the pixel area 311 include a reset transistor 321, a floating diffusion 324, amplification transistor 322, and a selection transistor 323. The circuit elements of the address event detection readout circuit 400 of the unit pixel 310 located within the pixel area 311 include a first and second log transistors 411 and 414 and first and second amplification transistors 412 and 413. The pixel imaging signal readout circuit 320 is connected to the photoelectric conversion element 333 by a first transmission transistor 331, while the address event detection read out circuit 320 is connected to the photoelectric conversion element 333 by a second transmission transistor 332. The first and second transmission transistors 331 and 332 are also located within the pixel area 311.

The first transmission transistor 331 in the second exemplary embodiment is formed at a location corresponding to a first portion or corner of the photoelectric conversion element 333 formed by a first side (the top side in FIG. 13) and a second side (the right side in FIG. 13) of the photoelectric conversion element 333. The second transmission transistor 332 is formed at a location corresponding to a second portion or corner of the photoelectric conversion element 333 formed by the first side and a third side (the left side in FIG. 13) of the photoelectric conversion element 333.

FIG. 14 is a plan view of a portion of a pixel array unit 300 comprising a group 314 of unit pixels 310 that are each configured according to the second exemplary embodiment. More particularly, the unit pixels 310 of the pixel group 314 include a 2×2 subarray of first 310.1, second 310.2, third 310.3, and fourth 310.4 unit pixels 310. In accordance with at least some embodiments of the present disclosure, the group 314 of unit pixels 310 may be configured as a pixel group 314 configured in a pattern 310A that includes an assembly of unit pixels 310 that receive different wavelength components. As shown in FIG. 14, there is no sharing of the circuit elements shown as being included in each individual unit pixel 310. Instead, the isolation structures 1208 that are provided around each of the unit pixel areas 311 separate the unit pixels 310 from one another. As shown, when unit pixels 310 are aggregated into groups 314, isolation structures between neighboring unit pixels 310 can be shared such that the isolation structure 1208 that defines a side of a first unit pixel (e.g. unit pixel 310.1) can also define a side of an adjacent unit pixel (e.g. unit pixel 310.2). In accordance with embodiments of the present disclosure, the isolation structures 1208 may be in the form of full thickness dielectric trench isolation or simply full thickness trench isolation (RFTI) structures.

Figure 15:
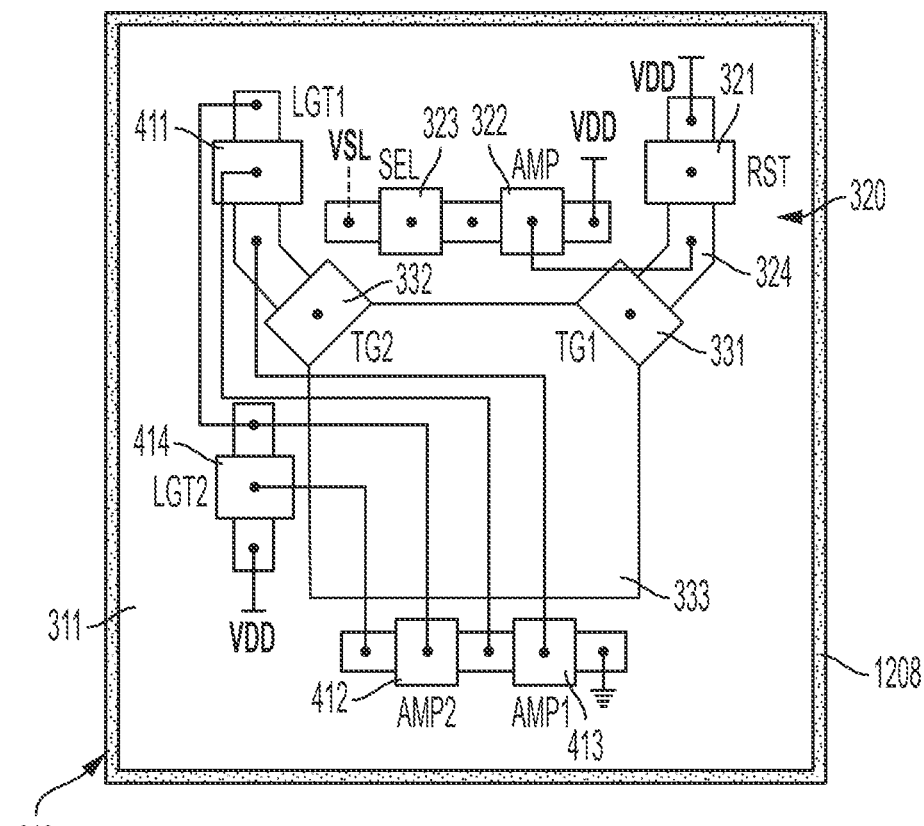
FIG. 15 is a plan view of a pixel configuration in accordance with a third exemplary embodiment of the present disclosure.
Figure 16:
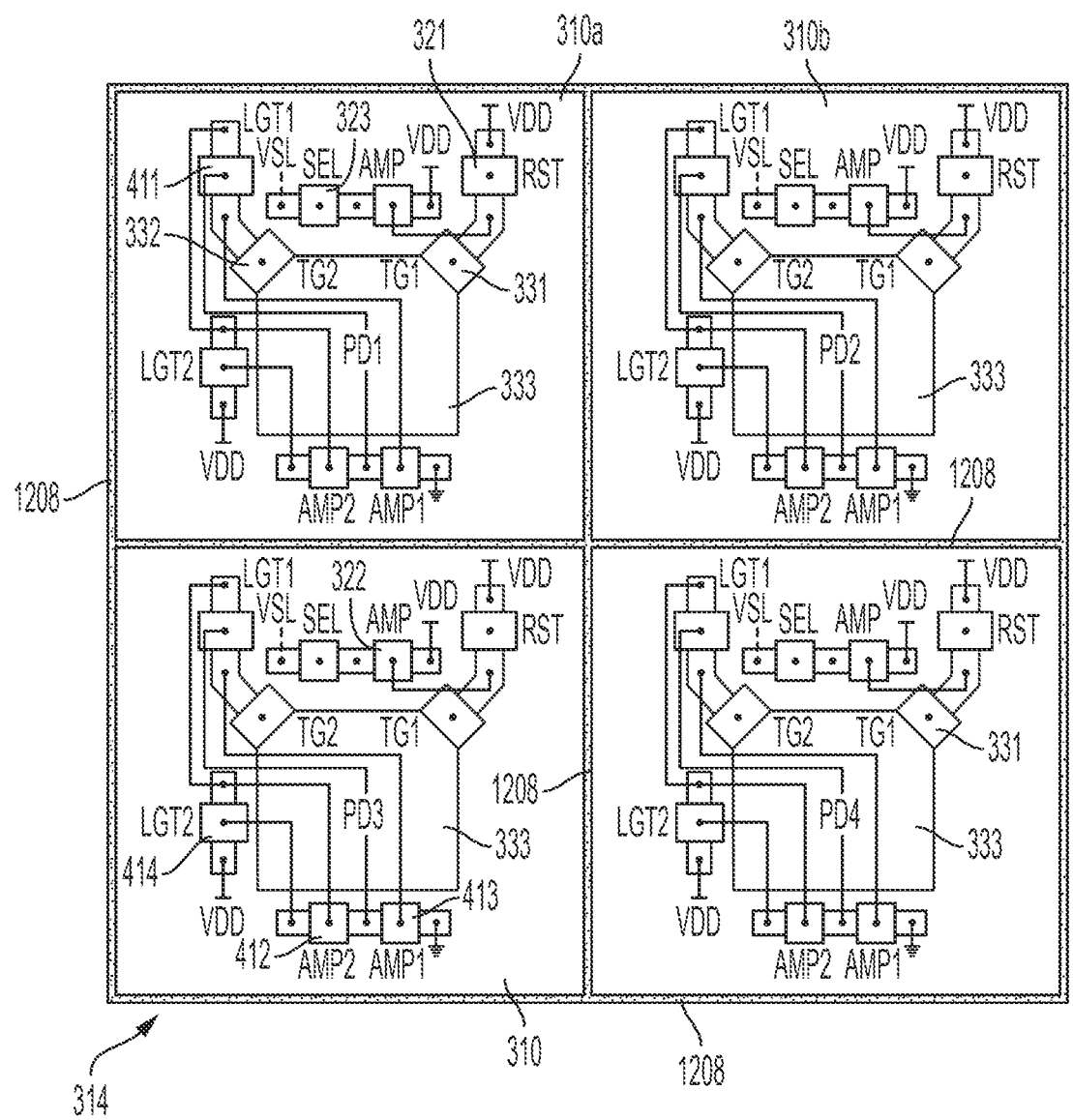
FIG. 16 is a plan view of a portion of a pixel array comprising a group of pixels configured as in the third exemplary embodiment.

FIG. 15 is a plan view of a pixel configuration in accordance with a third exemplary embodiment of the present disclosure, and FIG. 16 is a plan view of a portion of a pixel array comprising a group of pixels configured as in the third exemplary embodiment. More particularly, FIG. 15 is a top view illustrating a schematic configuration example of a unit pixel 310 according to the third exemplary embodiment. As in the second embodiment, the photoelectric conversion element 333 of the unit pixel 310 in this third embodiment has a generally rectangular shape, although other shapes are possible. However, in this third example configuration, the components of the unit pixel 310 are arranged differently than the arrangement of the second embodiment. This alternate configuration can simplify the wirings required to interconnect various circuit elements of the unit pixel 310. In particular, in this third example embodiment the circuit elements associated with the pixel imaging signal generation unit or readout circuit 320 are located adjacent one side of the photoelectric conversion element 333 (the top side in FIG. 15). The first log transistor 411 of the address event detection unit or readout circuit 400 is located on the same side of the photoelectric conversion as the circuit elements of the pixel imaging signal generation readout circuit 320. The amplification transistors 412 and 413 of the address event detection readout circuit 400 are located adjacent another, opposite side of the photoelectric conversion element 333 (the bottom side in FIG. 15). The second log transistor 414 of the address event detection readout circuit 400 is located adjacent a side of the photoelectric conversion element 333 (the left side in FIG. 15), between the top side edge and a bottom side edge of the photoelectric conversion element 333. The components of the unit pixel 310 are placed within a pixel area 311 bordered by an isolation structure 1208. In this example the pixel area 311 has a rectangular shape, though other shapes are possible.

In this third embodiment, the circuit elements of the pixel imaging signal readout circuit 320 of the unit pixel 310 located within the pixel area 311 include a reset transistor 321, a floating diffusion 324, amplification transistor 322, and a selection transistor 323. The circuit elements of the address event detection readout circuit 400 of the unit pixel 310 located within the pixel area 311 include the first and second log transistors 411 and 414 and the first and second amplification transistors 412 and 413. The pixel imaging signal readout circuit 320 is connected to the photoelectric conversion element 333 by a first transmission transistor 331, while the address event detection read out circuit 320 is connected to the photoelectric conversion element 333 by a second transmission transistor 332. The first and second transmission transistors 331 and 332 are also located within the pixel area 311.

In this third example embodiment, the first transmission transistor 331 is formed at a location corresponding to a first portion or corner of the photoelectric conversion element 333 formed by a first side (the top side in FIG. 15) and a second side (the right side in FIG. 15) of the photoelectric conversion element 333. The second transmission transistor 332 is formed at a location corresponding to a second portion or corner of the photoelectric conversion element 333 formed by the first side and a third side (the left side in FIG. 15) of the photoelectric conversion element 333.

FIG. 16 is a plan view of a portion of a pixel array unit 300 comprising a group 314 of unit pixels 310 that are each configured according to the third exemplary embodiment. More particularly, the unit pixels 310 of the pixel group 314 include a 2×2 subarray of first 310.1, second 310.2, third 310.3, and fourth 310.4 unit pixels 310. In accordance with at least some embodiments of the present disclosure, the group 314 of unit pixels 310 may be configured as a pixel group 314 configured in a pattern 310A that includes an assembly of unit pixels 310 that receive different wavelength components. As shown in FIG. 16, there is no sharing of the circuit elements shown as being included in each individual unit pixel 310. Instead, the isolation structures 1208 that are provided around each of the unit pixel areas 311 separate the unit pixels 310 from one another. As shown, when unit pixels 310 are aggregated into groups 314, isolation structures between neighboring unit pixels 310 can be shared such that the isolation structure 1208 that defines a side of a first unit pixel (e.g. unit pixel 310.1) can also define a side of an adjacent unit pixel (e.g. unit pixel 310.2). In accordance with embodiments of the present disclosure, the isolation structures 1208 may be in the form of full thickness dielectric trench isolation or simply full thickness trench isolation (RFTI) structures.

Figure 17:
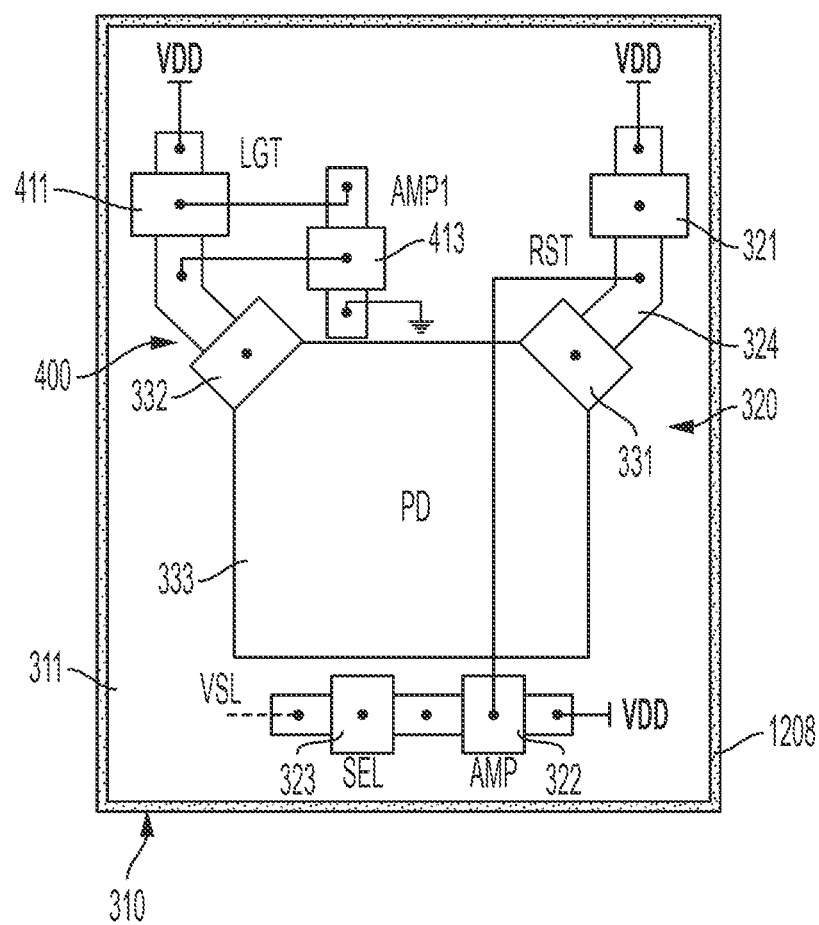
FIG. 17 is a plan view of a pixel configuration in accordance with a fourth exemplary embodiment of the present disclosure.
Figure 18:
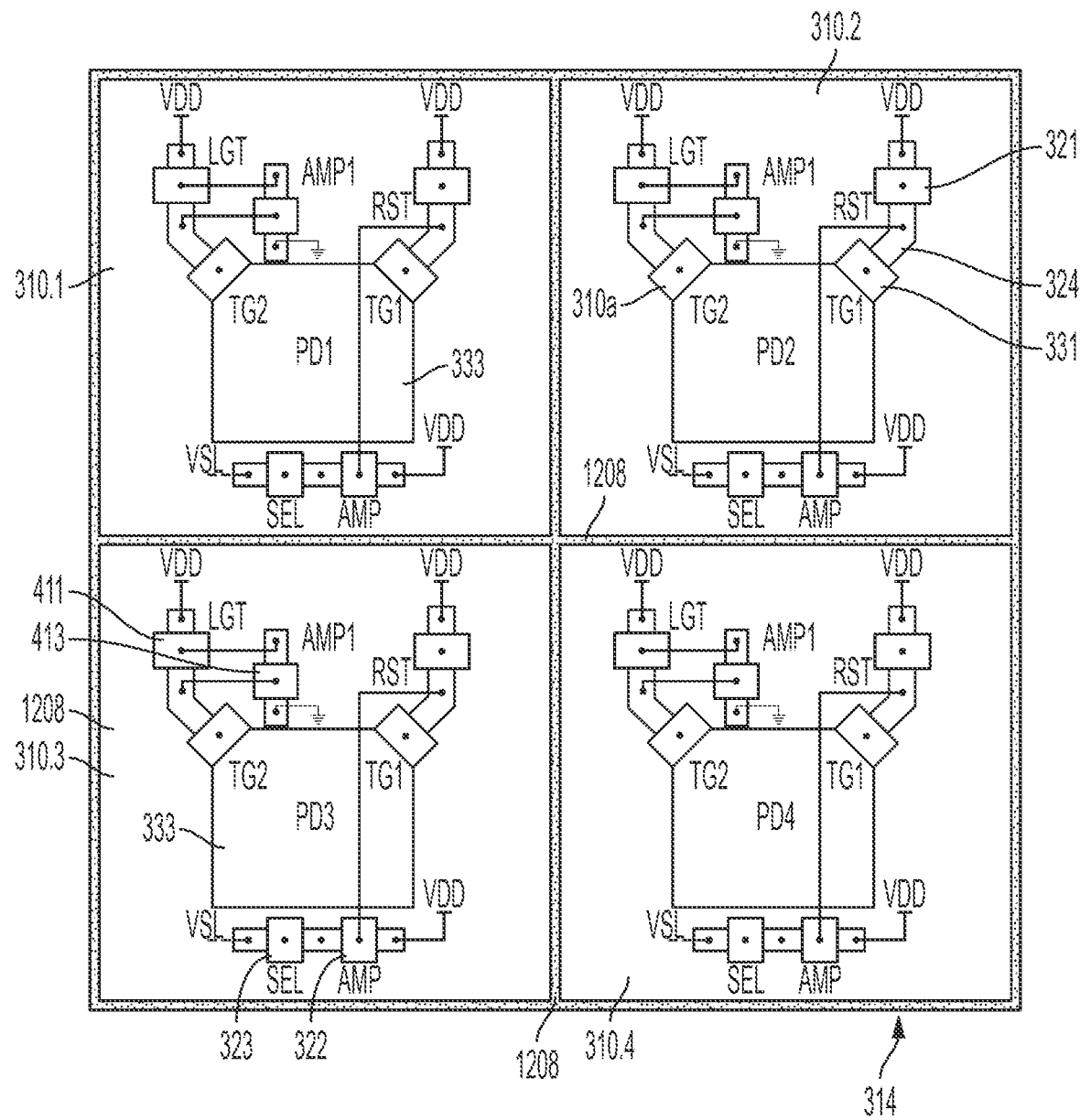
FIG. 18 is a plan view of a portion of a pixel array comprising a group of pixels configured as in the fourth exemplary embodiment.

FIG. 17 is a plan view of a pixel configuration in accordance with a fourth exemplary embodiment of the present disclosure, and FIG. 18 is a plan view of a portion of a pixel array comprising a group of pixels configured as in the fourth exemplary embodiment. More particularly, FIG. 17 is a top view illustrating a schematic configuration example of a unit pixel 310 according to the fourth exemplary embodiment. As in the second and third embodiments, the photoelectric conversion element 333 of the unit pixel 310 in this fourth embodiment has a generally rectangular shape, although other shapes are possible. However, the circuit elements of the address event detection unit or readout circuit 400 of this fourth example configuration include two transistors, whereas the first, second, and third example embodiments feature address event detection readout circuits 400 that included four transistors. This two transistor configuration allows the photoelectric conversion element 333 to have a larger area within a given pixel area 311 as compared to embodiments incorporating a four transistor address event detection readout circuit 400. However, the gain of the two transistor arrangement may be less than the four transistor configuration. In this fourth example embodiment, all of the circuit elements associated with the address event detection readout circuit 400 are located adjacent one side (the top side in FIG. 17) of the photoelectric conversion element 333, while some of the circuit elements associated with the pixel imaging signal generation readout circuit 320 are located adjacent the top side of the photoelectric conversion element 333, and other components of the pixel imaging signal generation readout circuit 320 are located adjacent the opposite side (the bottom side in FIG. 17) of the photoelectric conversion element 333. The components of the unit pixel 310 are located within a pixel area 311 bordered by an isolation structure 1208. In this example the pixel area 311 has a rectangular shape, though other shapes are possible, In this fourth embodiment, the circuit elements of the pixel imaging signal readout circuit 320 of the unit pixel 310 located within the pixel area 311 include a reset transistor 321, a floating diffusion 324, amplification transistor 322, and a selection transistor 323. The circuit elements of the address event detection readout circuit 400 of the unit pixel 310 located within the pixel area 311 include a first log transistors 411 and a first amplification transistor 413. The pixel imaging signal readout circuit 320 is connected to the photoelectric conversion element 333 by a first transmission transistor 331, while the address event detection at read out circuit 320 is connected to the photoelectric conversion element 333 by a second transmission transistor 332. The first and second transmission transistors 331 and 332 are also located within the pixel area 311.

In this fourth example embodiment, the first transmission transistor 331 is formed at a location corresponding to a first portion or corner of the photoelectric conversion element 333 formed by a first side (the top side in FIG. 17) and a second side (the right side in FIG. 17) of the photoelectric conversion element 333. The second transmission transistor 332 is formed at a location corresponding to a second portion or corner of the photoelectric conversion element 333 formed by the first side and a third side (the left side in FIG. 17) of the photoelectric conversion element 333.

FIG. 18 is a plan view of a portion of a pixel array unit 300 comprising a group 314 of unit pixels 310 that are each configured according to the fourth exemplary embodiment. More particularly, the unit pixels 310 of the pixel group 314 include a 2×2 subarray of first 310.1, second 310.2, third 310.3, and fourth 310.4 unit pixels 310. In accordance with at least some embodiments of the present disclosure, the group 314 of unit pixels 310 may be configured as a pixel group 314 configured in a pattern 310A that includes an assembly of unit pixels 310 that receive different wavelength components. As shown in FIG. 18, there is no sharing of the circuit elements shown as being included in each individual unit pixel 310. Instead, the isolation structures 1208 that are provided around each of the unit pixel areas 311 separate the unit pixels 310 from one another. As shown, when unit pixels 310 are aggregated into groups 314, isolation structures between neighboring unit pixels 310 can be shared such that the isolation structure 1208 that defines a side of a first unit pixel (e.g. unit pixel 310.1) can also define a side of an adjacent unit pixel (e.g. unit pixel 310.2). In accordance with embodiments of the present disclosure, the isolation structures 1208 may be in the form of full thickness dielectric trench isolation or simply full thickness trench isolation (RFTI) structures.

Figure 19:
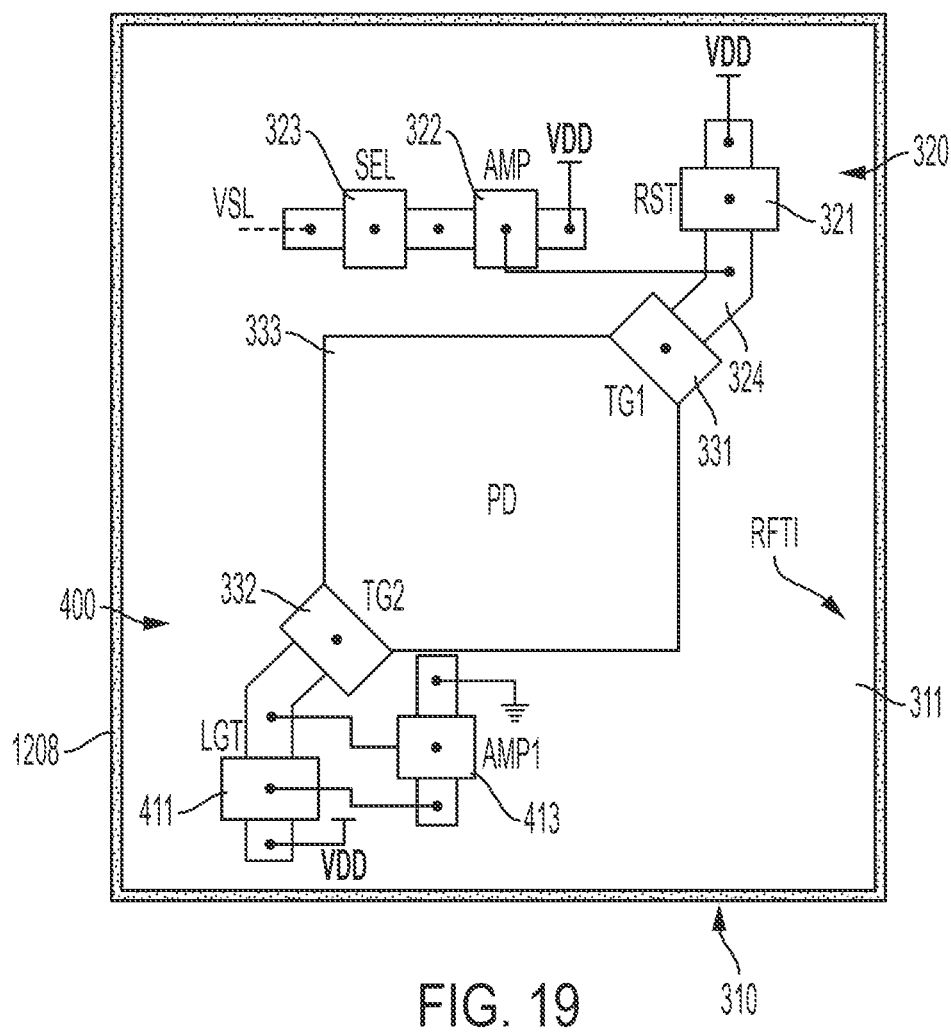
FIG. 19 is a plan view of a pixel configuration in accordance with a fifth exemplary embodiment of the present disclosure.
Figure 20:
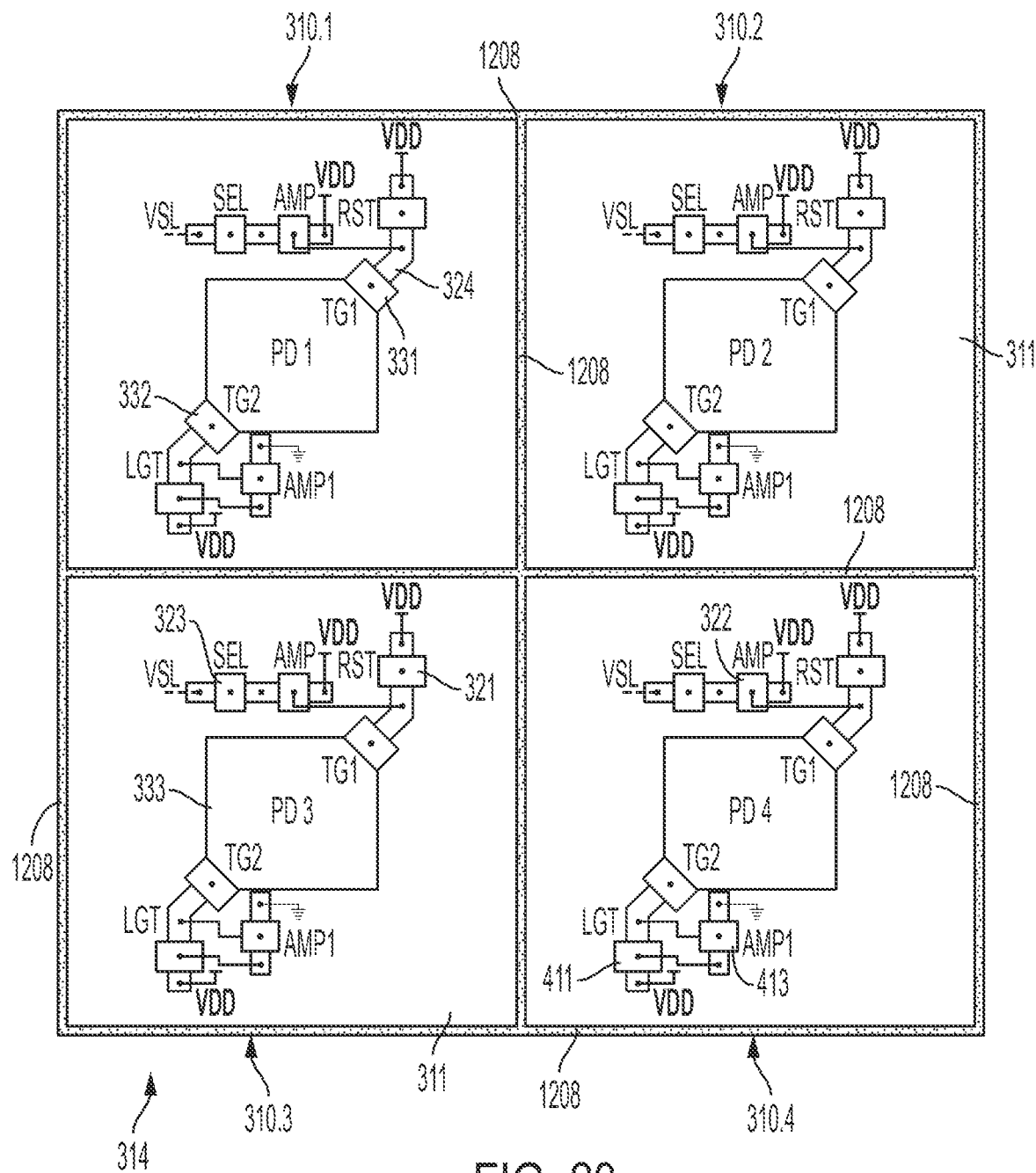
FIG. 20 is a plan view of a portion of a pixel array comprising a group of pixels configured as in the fifth exemplary embodiment.

FIG. 19 is a plan view of a pixel configuration in accordance with a fifth exemplary embodiment of the present disclosure, and FIG. 20 is a plan view of a portion of a pixel array comprising a group of pixels configured as in the fifth exemplary embodiment. More particularly, FIG. 19 is a top view illustrating a schematic configuration example of a unit pixel 310 according to the fifth exemplary embodiment. As in the second, third, and fourth embodiments, the photoelectric conversion element 333 of the unit pixel 310 in this fifth embodiment has a generally rectangular shape, although other shapes are possible. As in the fourth example, the circuit elements of the address event detection unit or readout circuit 400 of this fifth example configuration include two transistors. In this fifth example embodiment, all of the circuit elements associated with the pixel imaging signal generation readout circuit 320 are located adjacent the top side of the photoelectric conversion element 333, and all of the circuit elements associated with the address event detection readout circuit 400 are located adjacent the opposite or bottom side of the photoelectric conversion element 333. The components of the unit pixel 310 are located within a pixel area 311 bordered by an isolation structure 1208. In this example the pixel area 311 has a rectangular shape, though other shapes are possible, In this fifth embodiment, the circuit elements of the pixel imaging signal readout circuit 320 of the unit pixel 310 located within the pixel area 311 include a reset transistor 321, a floating diffusion 324, an amplification transistor 322, and a selection transistor 323. The circuit elements of the address event detection readout circuit 400 of the unit pixel 310 located within the pixel area 311 include a first log transistor 411 and a first amplification transistor 413. The pixel imaging signal readout circuit 320 is connected to the photoelectric conversion element 333 by a first transmission transistor 331, while the address event detection read out circuit 320 is connected to the photoelectric conversion element 333 by a second transmission transistor 332. The first and second transmission transistors 331 and 332 are also located within the pixel area 311.

In this fifth example embodiment, the first transmission transistor 331 is formed at a location corresponding to a first or portion of corner of the photoelectric conversion element 333 formed by a first side (the top side in FIG. 19) and a second side (the right side in FIG. 19) of the photoelectric conversion element 333. The second transmission transistor 332 is formed at a location corresponding to a second portion or corner of the photoelectric conversion element 333 formed by a third side (the left side in FIG. 19) and a fourth side (the bottom side in FIG. 19) of the photoelectric conversion element 333.

FIG. 20 is a plan view of a portion of a pixel array unit 300 comprising a group 314 of unit pixels 310 that are each configured according to the fifth exemplary embodiment. More particularly, the unit pixels 310 of the pixel group 314 include a 2×2 subarray of first 310.1, second 310.2, third 310.3, and fourth 310.4 unit pixels 310. In accordance with at least some embodiments of the present disclosure, the group 314 of unit pixels 310 may be configured as a pixel group 314 configured in a pattern 310A that includes an assembly of unit pixels 310 that receive different wavelength components. As shown in FIG. 20, there is no sharing of the circuit elements shown as being included in each individual unit pixel 310. Instead, the isolation structures 1208 that are provided around each of the unit pixel areas 311 separate the unit pixels 310 from one another. As also shown, when unit pixels 310 are aggregated into groups 314, isolation structures between neighboring unit pixels 310 can be shared such that the isolation structure 1208 that defines a side of a first unit pixel (e.g. unit pixel 310.1) can also define a side of an adjacent unit pixel (e.g. unit pixel 310.2). In accordance with embodiments of the present disclosure, the isolation structures 1208 may be in the form of full thickness dielectric trench isolation or simply full thickness trench isolation (RFTI) structures.

Figure 21:
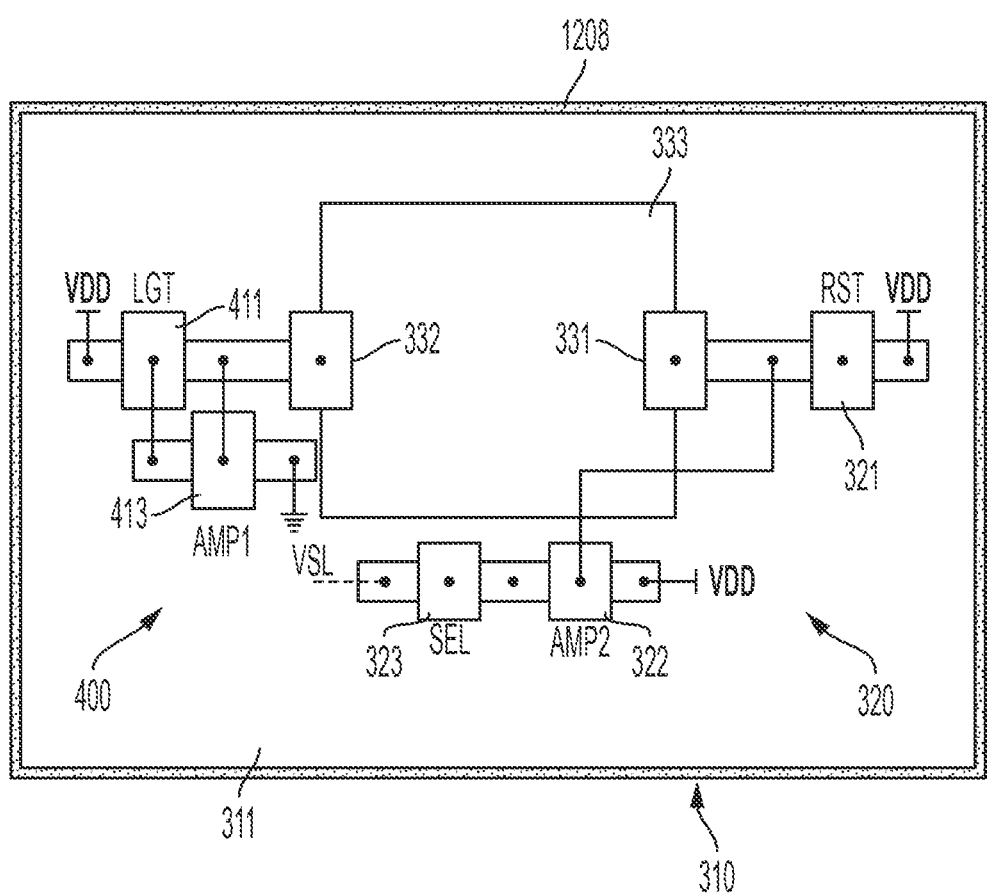
FIG. 21 is a plan view of a pixel configuration in accordance with a sixth exemplary embodiment of the present disclosure.
Figure 22:
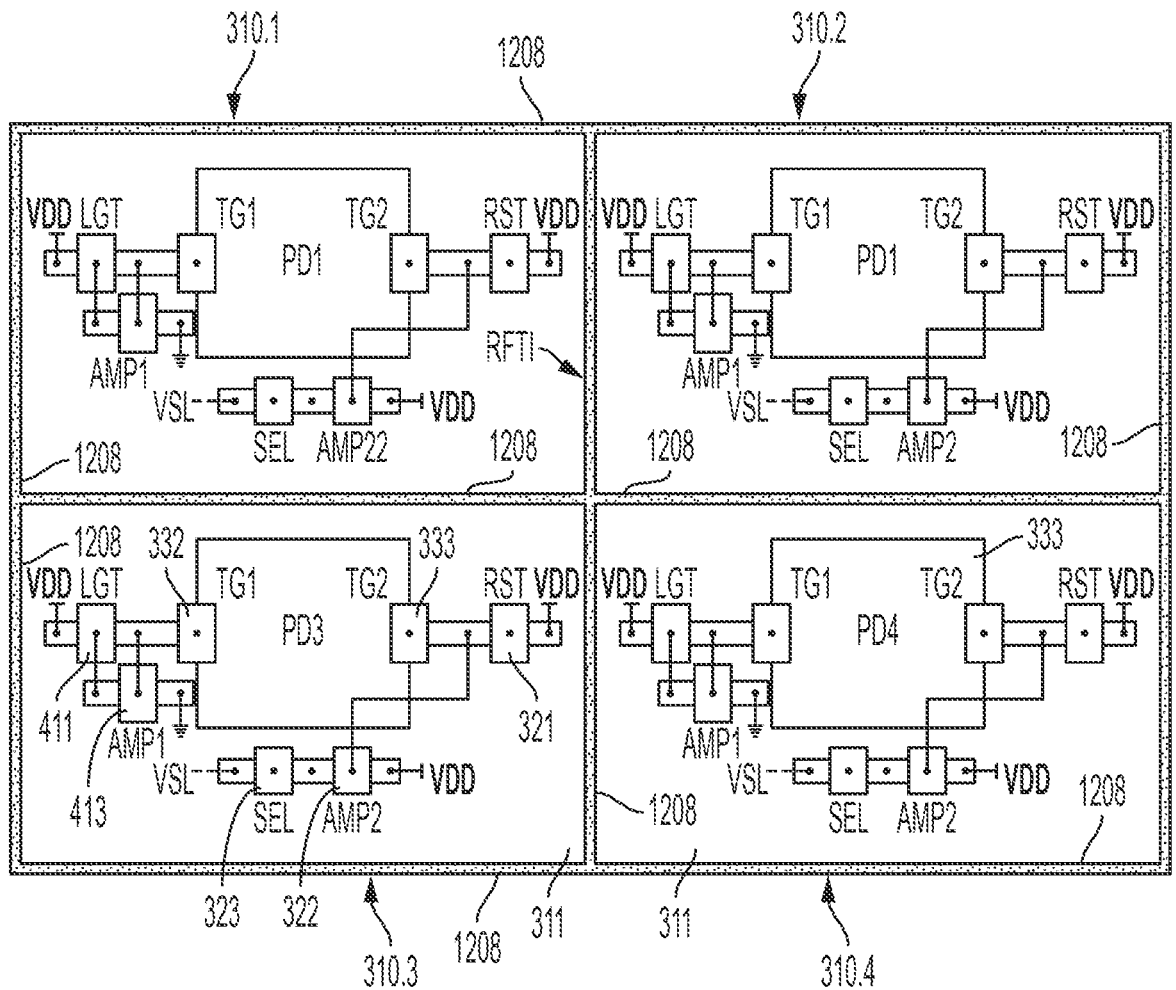
FIG. 22 is a plan view of a portion of a pixel array comprising a group of pixels configured as in the sixth exemplary embodiment.

FIG. 21 is a plan view of a pixel configuration in accordance with a sixth exemplary embodiment of the present disclosure, and FIG. 22 is a plan view of a portion of a pixel array comprising a group of pixels configured as in the sixth exemplary embodiment. More particularly, FIG. 21 is a top view illustrating a schematic configuration example of a unit pixel 310 according to the sixth exemplary embodiment. As in the second, third, fourth, and fifth embodiments, the photoelectric conversion element 333 of the unit pixel 310 in this sixth embodiment has a generally rectangular shape, although other shapes are possible. As in the fourth and fifth example, the circuit elements of the address event detection unit or readout circuit 400 of this sixth example configuration include two transistors. In this sixth example embodiment, all of the circuit elements associated with the address event detection readout circuit 400 are located adjacent the left side of the photoelectric conversion element 333, while the circuit elements associated with the pixel imaging signal generation readout circuit 320 are located adjacent the right and bottom sides of the photoelectric conversion element 333. The components of the unit pixel 310 are located within a pixel area 311 bordered by an isolation structure 1208. In this example the pixel area 311 has a rectangular shape, though other shapes are possible.

In this sixth embodiment, the circuit elements of the pixel imaging signal readout circuit 320 of the unit pixel 310 located within the pixel area 311 include a reset transistor 321, a floating diffusion 324, an amplification transistor 322, and a selection transistor 323. The circuit elements of the address event detection readout circuit 400 of the unit pixel 310 located within the pixel area 311 include a first log transistor 411 and a first amplification transistor 413. The pixel imaging signal readout circuit 320 is connected to the photoelectric conversion element 333 by a first transmission transistor 331, while the address event detection read out circuit 320 is connected to the photoelectric conversion element 333 by a second transmission transistor 332. The first and second transmission transistors 331 and 332 are also located within the pixel area 311.

In this sixth example embodiment, the first transmission transistor 331 is located along a portion of one side of the photoelectric conversion element 333 (the right side in FIG. 21). The second transmission transistor 332 is located along a portion of another side of the photoelectric conversion element 333 (the left side in FIG. 21).

FIG. 22 is a plan view of a portion of a pixel array unit 300 comprising a group 314 of unit pixels 310 that are each configured according to the sixth exemplary embodiment. More particularly, the unit pixels 310 of the pixel group 314 include a 2×2 subarray of first 310.1, second 310.2, third 310.3, and fourth 310.4 unit pixels 310. In accordance with at least some embodiments of the present disclosure, the group 314 of unit pixels 310 may be configured as a pixel group 314 configured in a pattern 310A that includes an assembly of unit pixels 310 that receive different wavelength components. As shown in FIG. 22, there is no sharing of the circuit elements shown as being included in each individual unit pixel 310. Instead, the isolation structures 1208 that are provided around each of the unit pixel areas 311 separate the unit pixels 310 from one another. As also shown, when unit pixels 310 are aggregated into groups 314, isolation structures between neighboring unit pixels 310 can be shared such that the isolation structure 1208 that defines a side of a first unit pixel (e.g. unit pixel 310.1) can also define a side of an adjacent unit pixel (e.g. unit pixel 310.2). In accordance with embodiments of the present disclosure, the isolation structures 1208 may be in the form of full thickness dielectric trench isolation or simply full thickness trench isolation (RFTI) structures.

Figure 23:
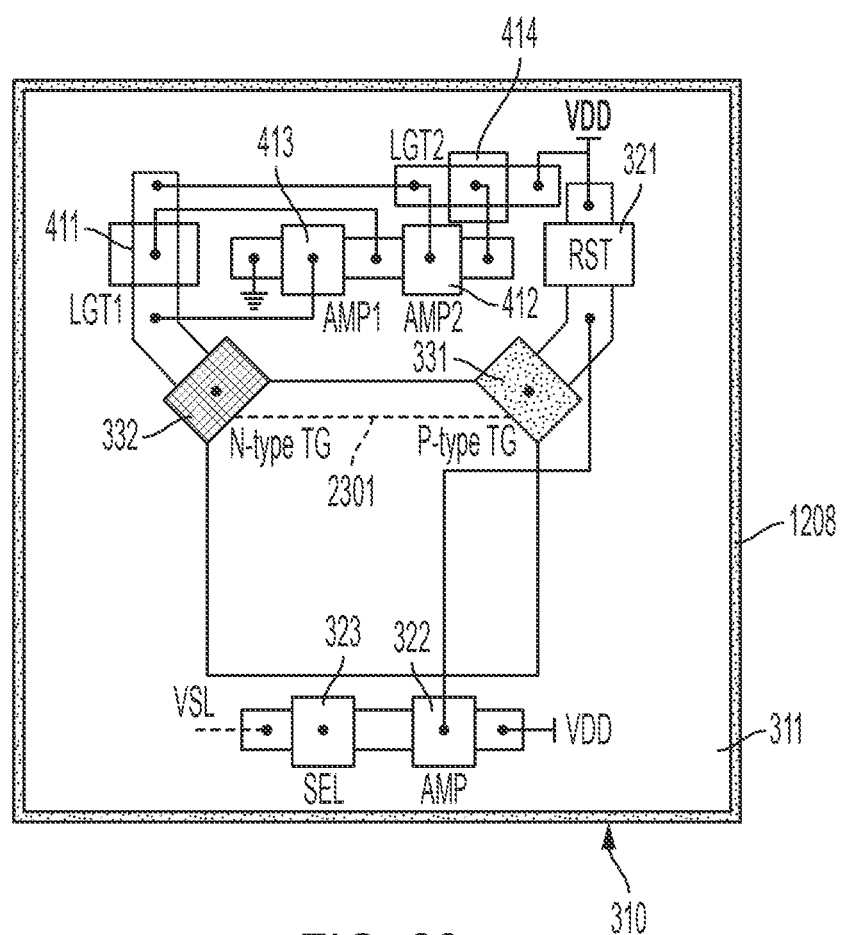
FIG. 23 is a plan view of a pixel configuration in accordance with a seventh exemplary embodiment of the present disclosure.
Figure 24:
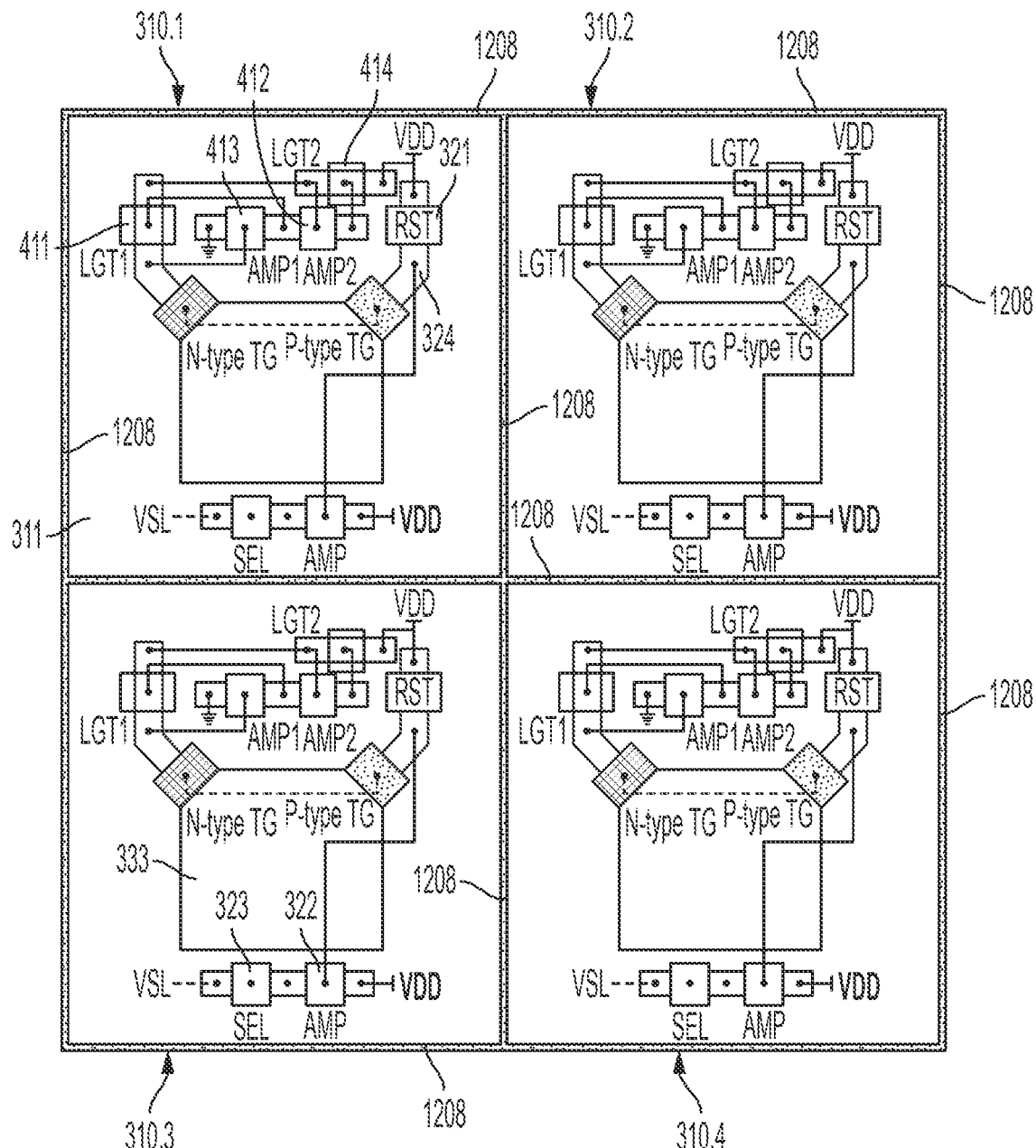
FIG. 24 is a plan view of a portion of a pixel array comprising a group of pixels configured as in the seventh exemplary embodiment.

FIG. 23 is a plan view of a pixel configuration in accordance with a seventh exemplary embodiment of the present disclosure, and FIG. 24 is a plan view of a portion of a pixel array comprising a group of pixels configured as in the seventh exemplary embodiment. More particularly, FIG. 23 is a top view illustrating a schematic configuration example of a unit pixel 310 according to the second exemplary embodiment. In this example, the photoelectric conversion element 333 of the unit pixel 310 has a generally rectangular shape. However, in accordance with further embodiments of the present disclosure, the photoelectric conversion element 331 can have any other shape, including but not limited to hexagonal, elliptical, or round. Also in this example, all of the circuit elements associated with the address event detection unit or readout circuit 400 are located adjacent one side (the top side in FIG. 13) of the photoelectric conversion element 333, while some of the circuit elements associated with the pixel imaging signal generation unit or readout circuit 320 are located adjacent the top side of the photoelectric conversion element 333, and other components of the pixel imaging signal generation readout circuit 320 are located adjacent the opposite side (the bottom side in FIG. 13) of the photoelectric conversion element 333. The components of the unit pixel 310 are placed within a pixel area 311 bordered by an isolation structure 1208. In this example the pixel area 311 has a rectangular shape, though other shapes are possible.

In this seventh example embodiment, the circuit elements of the pixel imaging signal readout circuit 320 of the unit pixel 310 located within the pixel area 311 include a reset transistor 321, a floating diffusion 324, amplification transistor 322, and a selection transistor 323. The circuit elements of the address event detection readout circuit 400 of the unit pixel 310 located within the pixel area 311 include a first and second log transistors 411 and 414 and first and second amplification transistors 412 and 413. The pixel imaging signal readout circuit 320 is connected to the photoelectric conversion element 333 by a first transmission transistor 331, while the address event detection read out circuit 320 is connected to the photoelectric conversion element 333 by a second transmission transistor 332. The first and second transmission transistors 331 and 332 are also located within the pixel area 311.

The first transmission transistor 331 in the seventh exemplary embodiment is formed at a location corresponding to a first or portion of corner of the photoelectric conversion element 333 formed by a first side (the top side in FIG. 23) and a second side (the right side in FIG. 23) of the photoelectric conversion element 333. In addition, the first transmission transistor 331 is a P-type MOS transistor. The second transmission transistor 332 is formed at a location corresponding to a second portion or corner of the photoelectric conversion element 333 formed by the first side and a third side (the left side in FIG. 13) of the photoelectric conversion element 333. The second transmission transistor 332 is an N-type MOS transistor. The transfer gate of the first transmission transistor 331 can be electrically connected to the transfer gate of the second transmission transistor 332 by a joint signal line 2301. This configuration allows the first and second transfer transistors 331 and 332 to be operated by a single signal line. More particularly, in response to a first signal provided by the joint signal line 2301, a first one of the first transmission transistor 331 and the second transmission transistor 332 can be placed in an ON-state, while a second one of the first transmission transistor 331 and the second transmission transistor 332 can be placed in an OFF-state. Conversely, in response to a second signal provided by the joint signal line 2301, the first one of the first transmission transistor 331 and the second transmission transistor 332 can be placed in an OFF-state, while the second one of the first transmission transistor 331 and the second transmission transistor 332 can be placed in an ON-state. The unit pixel 310 configured as in this seventh exemplary embodiment can provide increased switching speed between event detection and imaging modes. In accordance with further embodiments of the present disclosure, by providing separate signal lines to the first 331 and second 332 transmission transistors, imaging and DVS modes can be available simultaneously. As can be appreciated by one of skill in the art after consideration of the present disclosure, in an alternate configuration, the first transmission transistor 331 can be an N-type MOS transistor, and the second transmission transistor 332 can be a P-type MOS transistor. Moreover, as can be appreciated from the present disclosure, the general layout of the unit pixel 310 in this seventh exemplary embodiment is, except for the different compositions of the first 331 and second 332 transfer transistors, similar to the second exemplary embodiment. However, in accordance with further embodiments of the present disclosure, other embodiments, including exemplary embodiments 1 and 3-6 can also feature one N-type transfer transistor 331 or 332 and one P-type transfer transistor 331 or 332 to achieve the benefits of simultaneous operation in the imaging and DVS modes or enhanced switching speeds between modes. As can be appreciated by one of skill in the art after consideration of the present disclosure, where a transfer transistor 331 or 332 is of a particular type, the type of the other associated readout transistors should be changed to match that type and to therefore address the carriers read out by the transfer transistor 331 or 332.

FIG. 24 is a plan view of a portion of a pixel array unit 300 comprising a group 314 of unit pixels 310 that are each configured according to the seventh exemplary embodiment. More particularly, the unit pixels 310 of the pixel group 314 include a 2×2 subarray of first 310.1, second 310.2, third 310.3, and fourth 310.4 unit pixels 310. In accordance with at least some embodiments of the present disclosure, the group 314 of unit pixels 310 may be configured as a pixel group 314 configured in a pattern 310A that includes an assembly of unit pixels 310 that receive different wavelength components. As shown in FIG. 24, there is no sharing of the circuit elements shown as being included in each individual unit pixel 310. Instead, the isolation structures 1208 that are provided around each of the unit pixel areas 311 separate the unit pixels 310 from one another. As shown, when unit pixels 310 are aggregated into groups 314, isolation structures between neighboring unit pixels 310 can be shared such that the isolation structure 1208 that defines a side of a first unit pixel (e.g. unit pixel 310.1) can also define a side of an adjacent unit pixel (e.g. unit pixel 310.2). In accordance with embodiments of the present disclosure, the isolation structures 1208 may be in the form of full thickness dielectric trench isolation or simply full thickness trench isolation (RFTI) structures.

In an imaging mode, the first transfer transistor 331 associated with a photoelectric conversion unit 333 of one or more unit pixels 310 within the pixel array unit 300 is placed in a conductive state (e.g. an ON-state) in order to operatively connect the photoelectric conversion unit 333 to the floating diffusion 324 of the pixel imaging signal generation readout circuit 320. In an event detection or dynamic vision sensor (DVS) mode, the second transfer transistor 332 associated with a photoelectric conversion unit 333 of one or more unit pixels is placed in a conductive state in order to operatively connect the selected photoelectric conversion unit 333 to the address event detection readout circuit 400.

In at least some operating modes, the second transfer transistor 332 of a selected unit pixel 310 remains closed (e.g. in an OFF-state) during an imaging operation, and the first transfer transistor 331 remains closed during an event detection mode. As can further be appreciated by one of skill in the art after consideration of the present disclosure, the opening of the first transfer transistor 331, the closing of the second transfer transistor 332, and the operation of the pixel image signal generation circuit 320 can be triggered by the detection of an event by the address event detection readout circuit 400 for the pixel group 310.

In at least some other operating modes, and in particular where the first transfer transistor 331 is configured a a P-type MOS transistor, and the second transfer transistor 332 is configured as an N-type MOS transistor, hole carriers can be provided to the pixel imaging signal generation readout circuit 320 and electrons can be provided to the address event detection readout circuit 400 simultaneously. Alternatively, where the first transfer transistor 331 is configured as an N-type MOS transistor, and the second transfer transistor 332 is configured as a P-type MOS transistor, electrons can be provided to the pixel imaging signal generation readout circuit 320 and hole carriers can be provided to the address event detection readout circuit 400 simultaneously. In accordance with still other operating modes, and in particular where a signal line 2301 is provided to electrically connect the first 331 and second 332 transfer transistors, a first one of the first transfer transistor 331 and the second transfer transistor 332 is configured as a P-type MOS transistor, and a second one of the first transfer transistor 331 and the second transfer transistor 332 is configured as an N-type MOS transistor, switching between imaging and DVS modes can be performed at high speed using a single switching signal provided to the first 331 and second 332 transfer transistors simultaneously.

Accordingly, embodiments of the present disclosure provide unit pixels 310 of an imaging device 100 that are capable of performing both event detection and imaging operations. Moreover, because the circuit elements of any one unit pixel 310 are separated from the circuit elements of any other unit pixel 310, improvements in image quality can be realized as compared to configurations in which such isolation between unit pixels 310 is not provided.

In accordance with embodiments of the present disclosure, the isolation structures 1208 may be in the form of RFTI structures. The RFTI structures 1208 extend through the entire thickness of a substrate 402 of the light receiving chip 201 in which the photodiodes 333 of the unit pixels 314 are formed. That is, in accordance with the least some embodiments of the present disclosure, the RFTI structures 1208 extend from at least a first, light incident surface 403 of the substrate 402 of the light receiving chip 201, to a second, non-light incident surface 404, of the substrate 402 of the light receiving chip 201. Accordingly, excellent isolation between adjacent unit pixels can be achieved.

Figure 25:
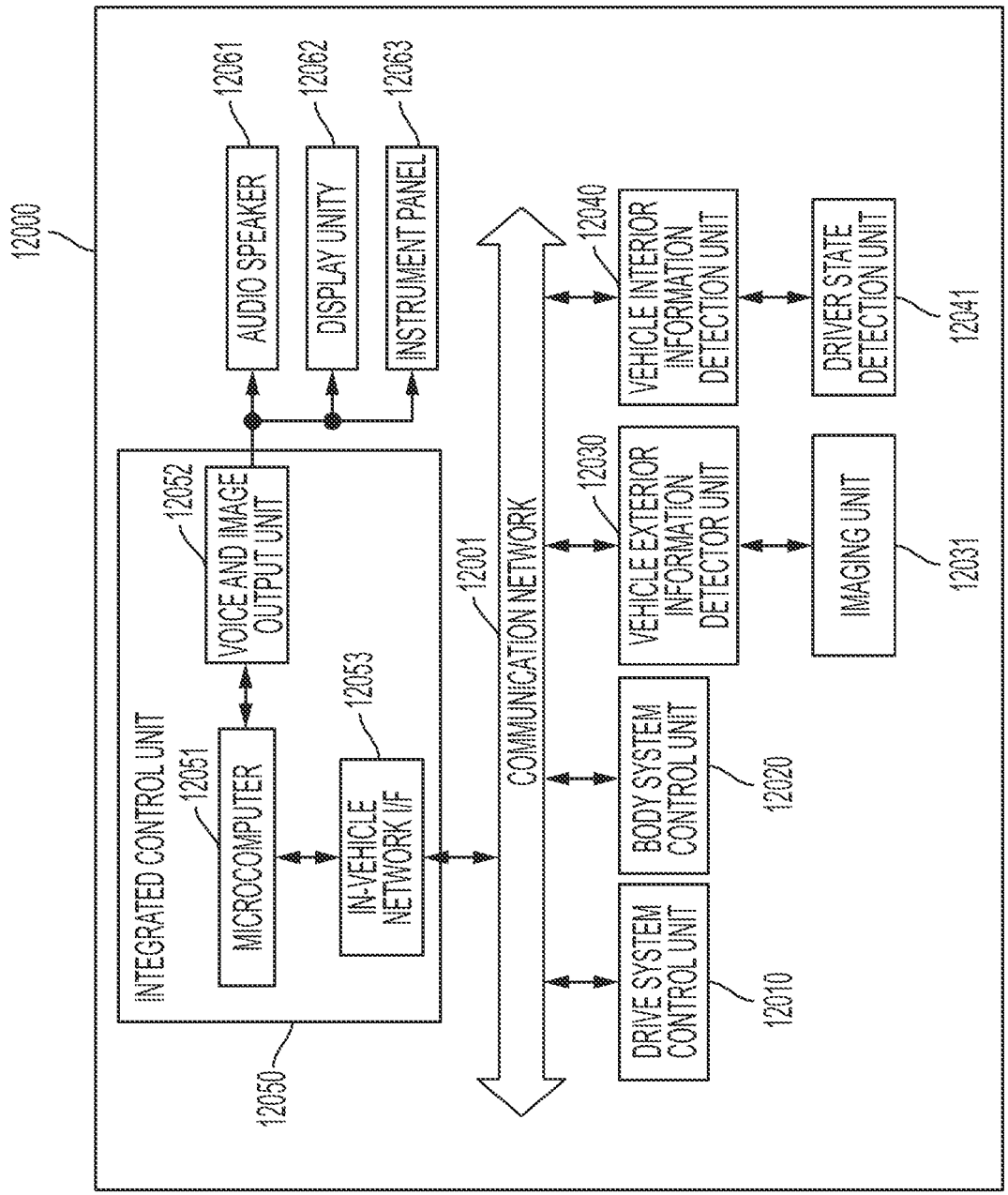
FIG. 25 is a block diagram illustrating an example of a schematic configuration of a vehicle control system.

FIG. 25 is a block diagram illustrating a schematic configuration example of a vehicle control system that is an example of a moving body control system to which the technology according to the present disclosure is applicable.

A vehicle control system 12000 includes a plurality of electronic control units which are connected to each other through a communication network 12001. In the example illustrated in FIG. 25, the vehicle control system 12000 includes a drive system control unit 12010, a body system control unit 12020, a vehicle exterior information detection unit 12030, a vehicle interior information detection unit 12040, and an integrated control unit 12050. In addition, as a functional configuration of the integrated control unit 12050, a microcomputer 12051, a voice and image output unit 12052, and an in-vehicle network I/F (interface) 12053 are illustrated in the drawing.

The drive system control unit 12010 controls an operation of a device relating to the drive system of the vehicle in accordance with various programs. For example, the drive system control unit 12010 functions as a control device of a drive force generation device such as an internal combustion engine and a drive motor which generate a drive force of the vehicle, a drive force transmission mechanism that transmits the drive force to wheels, a steering mechanism that adjusts a steering angle of the vehicle, and a braking device that generates a braking force of the vehicle, and the like.

The body system control unit 12020 controls an operation of various devices which are mounted to a vehicle body in accordance with various programs. For example, the body system control unit 12020 functions as a control device of a keyless entry system, a smart key system, a power window device, and various lamps such as a head lamp, a back lamp, a brake lamp, a blinker, and a fog lamp. In this case, an electric wave that is transmitted from a portable device that substitutes for a key, or signals of various switches can be input to the body system control unit 12020. The body system control unit 12020 receives input of the electric wave or the signals, and controls a door lock device, a power window device, a lamp, and the like of the vehicle.

The vehicle exterior information detection unit 12030 detects information regarding an outer side of the vehicle on which the vehicle control system 12000 is mounted. For example, an imaging unit 12031 is connected to the vehicle exterior information detection unit 12030. The vehicle exterior information detection unit 12030 allows the imaging unit 12031 to capture a vehicle exterior image, and receives the captured image. The vehicle exterior information detection unit 12030 may perform object detection processing of a person, a vehicle, an obstacle, a sign, a character on a load, or the like or distance detection processing on the basis of the image that is received.

The imaging unit 12031 is an optical sensor that receives light and outputs an electric signal corresponding to a light-reception amount. The imaging unit 12031 may output the electric signal as an image or as distance measurement information. In addition, light received by the imaging unit 12031 may be visible light, or invisible light such as infrared rays. Moreover, the imaging unit 12031 can include a a solid-state imaging device 200 incorporating a pixel array unit 300 with the unit pixels 310 configured and isolated from other unit pixels 310 within the pixel array unit 300 in accordance with embodiments of the present disclosure.

The vehicle interior information detection unit 12040 detects vehicle interior information. For example, a driver state detection unit 12041 that detects a driver state is connected to the vehicle interior information detection unit 12040. For example, the driver state detection unit 12041 includes a camera that images a driver, and the vehicle interior information detection unit 12040 may calculate the degree of fatigue or the degree of concentration of a driver on the basis of detection information that is input from the driver state detection unit 12041, or may determine whether or not the driver drowses.

The microcomputer 12051 calculates a control target value of the drive force generation device, the steering mechanism, or the braking device on the basis of vehicle interior or exterior information that is acquired by the vehicle exterior information detection unit 12030 or the vehicle interior information detection unit 12040, and can output a control command to the drive system control unit 12010. For example, the microcomputer 12051 can perform a cooperative control to realize a function of an advanced driver assistance system (ADAS) which includes collision avoidance or impact mitigation of the vehicle, following travel based on an inter-vehicle distance, vehicle speed maintenance travel, vehicle collision alarm, vehicle lane deviation alarm, and the like.

In addition, the microcomputer 12051 can perform a cooperative control for automatic driving and the like in which the vehicle autonomously travels without depending on an operation of a driver by controlling the drive force generation device, the steering mechanism, the braking device, and the like on the basis of information in the vicinity of the vehicle which is acquired by the vehicle exterior information detection unit 12030 or the vehicle interior information detection unit 12040.

The microcomputer 12051 can output a control command to the body system control unit 12020 on the basis of the vehicle exterior information acquired by the vehicle exterior information detection unit 12030. For example, the microcomputer 12051 can perform a cooperative control to realize glare protection such as switching of a high beam into a low beam by controlling the head lamp in correspondence with a position of a preceding vehicle or an oncoming vehicle which is detected by the vehicle exterior information detection unit 12030.

The voice and image output unit 12052 transmits at least one output signal between a voice and an image to an output device capable of visually or aurally notifying a passenger in a vehicle or an outer side of the vehicle of information. In the example in FIG. 30, as the output device, an audio speaker 12061, a display unit 12062, and an instrument panel 12063 are exemplified. For example, the display unit 12062 may include at least one of an on-board display or a head-up display.

Figure 26:
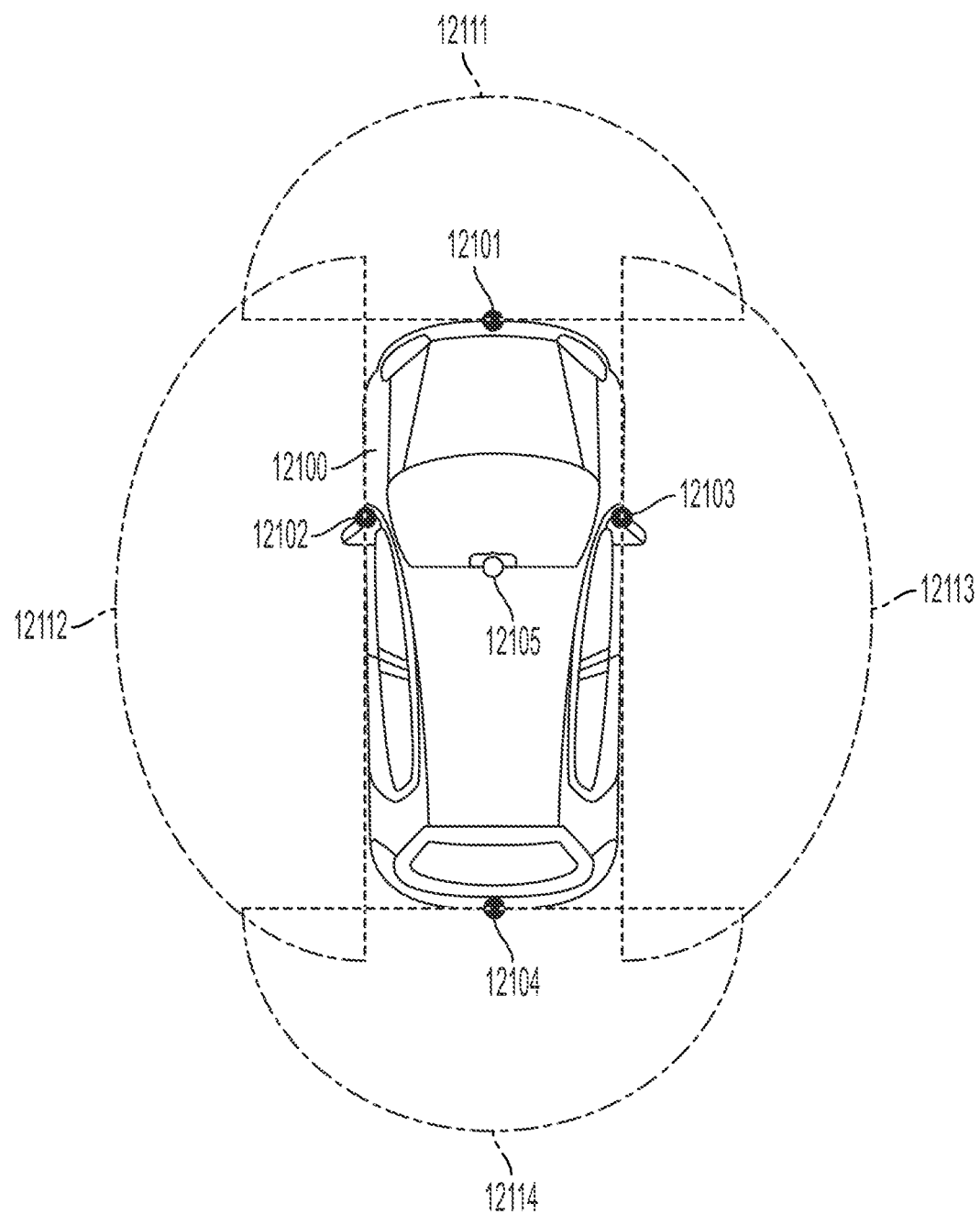
FIG. 26 is a view illustrating an example of an installation position of an out-of-vehicle information detection unit and an imaging unit.

FIG. 26 is a view illustrating an example of an installation position of the imaging unit 12031.

In FIG. 26, as the imaging unit 12031, imaging units 12101, 12102, 12103, 12104, and 12105 are provided.

For example, the imaging units 12101, 12102, 12103, 12104, and 12105 are installed at positions such as a front nose, a side-view mirror, a rear bumper, a back door, and an upper side of a windshield in a vehicle room, of the vehicle 12100. The imaging unit 12101 provided at the front nose, and the imaging unit 12105 that is provided on an upper side of the windshield in a vehicle room mainly acquire images on a forward side of the vehicle 12100. The imaging units 12102 and 12103 which are provided in the side-view mirror mainly acquire images on a lateral side of the vehicle 12100. The imaging unit 12104 that is provided in the rear bumper or the back door mainly acquires images on a backward side of the vehicle 12100. The imaging unit 12105 that is provided on an upper side of the windshield in the vehicle room can be mainly used to detect a preceding vehicle, a pedestrian, an obstacle, a traffic signal, a traffic sign, a vehicle lane, and the like.

Furthermore, FIG. 26 illustrates an example of a photographing range of the imaging units 12101 to 12104. An image capturing range 12111 represents an image capturing range of the imaging unit 12101 that is provided in the front nose, image capturing ranges 12112 and 12113 respectively represent image capturing ranges of the imaging units 12102 and 12103 which are provided in the side-view mirrors, an image capturing range 12114 represents an image capturing range of the imaging unit 12104 that is provided in the rear bumper or the back door. For example, when a plurality of pieces of image data captured by the imaging units 12101 to 12104 are superimposed on each other, it is possible to obtain an overlooking image when the vehicle 12100 is viewed from an upper side.

At least one of the imaging units 12101 to 12104 may have a function of acquiring distance information. For example, at least one of the imaging units 12101 to 12104 may be a stereo camera including a plurality of imaging elements, or may be an imaging element that includes pixels for phase difference detection.

For example, the microcomputer 12051 can extract a three-dimensional object, which is a closest three-dimensional object, particularly, on a proceeding path of the vehicle 12100 and travels in approximately the same direction as that of the vehicle 12100 that travels at a predetermined velocity (for example, 0 km/h or greater), as a preceding vehicle by obtaining distances to respective three-dimensional objects in the image capturing ranges 12111 to 12114 and a variation of the distances with the passage of time (relative velocity to the vehicle 12100) on the basis of the distance information obtained from the imaging units 12101 to 12104. In addition, the microcomputer 12051 can set a distance between vehicles to be secured in advance in front of the preceding vehicle to perform automatic brake control (also including a following stop control), an automatic acceleration control (also including a following acceleration control), and the like. As described above, it is possible to perform a cooperative control for automatic driving in which a vehicle autonomously travels without depending on an operation by a driver, and the like.

For example, the microcomputer 12051 can extract three-dimensional object data relating to a three-dimensional object by classifying a plurality of pieces of the three-dimensional object data into data of a two-wheel vehicle, data of typical vehicle, data of a large-sized vehicle, data of pedestrian, and data of other three-dimensional objects such as an electric pole on the basis of the distance information obtained from the imaging units 12101 to 12104, and can use the three-dimensional object data for automatic obstacle avoidance. For example, the microcomputer 12051 discriminates obstacles at the periphery of the vehicle 12100 into an obstacle that is visually recognized by a driver of the vehicle 12100 and an obstacle that is difficult for the driver to visually recognize. In addition, the microcomputer 12051 determines collision risk indicating the degree of danger of collision with each of the obstacles. In a situation in which the collision risk is equal to or greater than a set value, and collision may occur, the microcomputer 12051 can assist driving for collision avoidance by outputting an alarm to the driver through the audio speaker 12061 or the display unit 12062, or by performing compulsory deceleration or avoidance steering through the drive system control unit 12010.

At least one of the imaging units 12101 to 12104 may be an infrared camera that detects infrared rays. For example, the microcomputer 12051 can recognize a pedestrian by determining whether or not the pedestrian exists in images captured by the imaging units 12101 to 12104. For example, the pedestrian recognition is performed by a procedure of extracting a specific point in the images captured by the imaging units 12101 to 12104 as an infrared camera, and a procedure of performing pattern matching processing for a series of specific points indicating a contour line of an object to determine whether or not the object is a pedestrian. When the microcomputer 12051 determines that a pedestrian exists on the images captured by the imaging units 12101 to 12104, and recognizes the pedestrian, the voice and image output unit 12052 controls the display unit 12062 to overlap and display a quadrangular contour line for emphasis on the pedestrian who is recognized. In addition, the voice and image output unit 12052 may control the display unit 12062 to display an icon indicating the pedestrian or the like at a desired position.

Hereinbefore, description has been given of an example of the vehicle control system to which the technology according to the present disclosure is applicable. The technology according to the present disclosure is applicable to the imaging unit 12031, the driver state detection unit 12041, and the like among the above-described configurations.

Hereinbefore, embodiments of the present disclosure have been described, but the technical range of the present disclosure is not limited to the above-described embodiments, and various modifications can be made in a range not departing from the gist of the present disclosure. In addition, constituent elements in other embodiments and modification examples may be appropriately combined.

In addition, the effects in the embodiments described in this specification are illustrative only, and other effect may exist without a limitation.

Furthermore, the present technology can employ the following configurations.

(1) An imaging device, comprising:
a pixel array unit, wherein the pixel array unit includes:
a plurality of pixels;
an isolation structure, wherein each pixel in the plurality of pixels is separated from one or more neighboring pixels in the plurality of pixels by the isolation structure, and wherein each pixel includes:
a photoelectric conversion region;
a first transfer transistor;
a second transfer transistor;
a first readout circuit selectively coupled to the photoelectric conversion region by the first transfer transistor; and
a second readout circuit selectively coupled to the photoelectric conversion region by the second transfer transistor.

(2) The imaging device of (1), wherein the second readout circuit is an address event detection readout circuit.

(3) The imaging device of (1) or (2), wherein the first readout circuit is an imaging signal generation readout circuit.

(4) The imaging device of any of (1) to (3), wherein the pixel array unit includes a plurality of pixel groups, wherein each pixel with a first pixel group in the plurality of pixel groups is isolated from other pixels in the first pixel group.

(5) The imaging device of any of (1) to (4), wherein the isolation structure is a dielectric structure.

(6) The imaging device of (5), wherein the dielectric structure surrounds each of the pixels within the first pixel group.

(7) The imaging device of (6), wherein the dielectric structure is a full-thickness dielectric trench.

(8) The imaging device of any of (1) to (7), wherein the first readout circuit includes a floating diffusion layer, an amplification transistor, a selection transistor, and a reset transistor.

(9) The imaging device of any of (1) to (8), wherein the second readout circuit includes a current voltage conversion unit and a subtractor.

(10) The imaging device of any of (1) to (8), wherein the second readout circuit includes a first log transistor and a first amplification transistor.

(11) The imaging device of any of (1) to (8), wherein the second readout circuit includes a first log transistor, a second log transistor, a first amplification transistor, and a second amplification transistor.

(12) The imaging device of any of (1) to (11), wherein the first transfer transistor includes a first one of an N-type transfer gate and a P-type transfer gate, and wherein the second transfer transistor includes a second one of the N-type transfer gate and the P-type transfer gate.

(13) The imaging device of (12), wherein the photoelectric conversion region of at least a first pixel included in the plurality of pixels is selectively connected to the first and second readout circuits simultaneously.

(14) The imaging device of (12), further comprising:
a joint signal line, wherein the joint signal line electrically connects the first transfer gate to the second transfer gate.

(15) The imaging device of any of (1) to (14), wherein, for each pixel, all of the components of the first readout circuit are formed in a first half of the pixel, and all of the components of the second readout circuit are formed in a second half of the pixel.

(16) The imaging device of any of (1) to (15), wherein the photoelectric conversion region includes a plurality of sides in a plan view, wherein the first transfer gate is located along a first side of the photoelectric conversion unit, and wherein the second transfer gate is located along a second side of the photoelectric conversion region.

(17) The imaging device of (4), wherein each pixel group further includes a first unit pixel, a second unit pixel, a third unit pixel, and a fourth unit pixel, and wherein the first, second, third, and fourth unit pixels are disposed in a 2×2 array.

(18) The imaging device of any of (1) to (17), wherein the isolation structure defines a pixel area for each of the unit pixels, and wherein circuit elements of each unit pixel are separated from circuit elements of any neighboring unit pixel in the pixel array unit by the isolation structure.

(19) The imaging device of any of (1) to (18), wherein the first isolation structure is entirely a full thickness trench isolation structure.

(20) An electronic apparatus, comprising:
an imaging lens; and
a solid-state imaging device, including:
a pixel array unit, wherein the pixel array unit includes:
a plurality of pixels;
an isolation structure, wherein each pixel in the plurality of pixels is separated from one or more neighboring pixels in the plurality of pixels by the isolation structure, and wherein each pixel includes:
a photoelectric conversion region;
a first transfer transistor;
a second transfer transistor;
a first readout circuit selectively coupled to the photoelectric conversion region by the first transfer transistor; and
a second readout circuit selectively coupled to the photoelectric conversion region by the second transfer transistor; and
a control unit, wherein the control unit controls operation of the solid-state imaging device.

It should be understood by those skilled in the art that various modifications, combinations, sub-combinations and alterations may occur depending on design requirements and other factors insofar as they are within the scope of the appended claims or the equivalents thereof.

What is claimed is:
1. A light detecting device, comprising:
a pixel array unit, wherein the pixel array unit includes:
a plurality of pixels; and
an isolation structure, wherein each pixel in the plurality of pixels is separated from one or more neigh- boring pixels in the plurality of pixels by the isolation structure, and wherein a pixel of the plurality of pixels includes:
a photoelectric conversion region;
a first transfer transistor;
a second transfer transistor;
a first readout circuit selectively coupled to the photoelectric conversion region by the first transfer transistor; and
a second readout circuit selectively coupled to the photoelectric conversion region by the second transfer transistor,
wherein, all transistor components of the first readout circuit are located in a first area of the pixel in a plan view below the photoelectric conversion region, and all transistor components of the second readout circuit are located in a second area of the pixel above the photoelectric conversion region in the plan view,
wherein the first readout circuit includes a floating diffusion layer and an amplification transistor, a selection transistor, or a reset transistor, and
wherein the second readout circuit includes a first log transistor and a first amplification transistor.

2. The light detecting device of claim 1, wherein the second readout circuit includes an address event detection readout circuit.

3. The light detecting device of claim 2, wherein the first readout circuit includes an imaging signal generation readout circuit.

4. The light detecting device of claim 3, wherein the pixel array unit includes a plurality of pixel groups, and wherein each pixel within a first pixel group in the plurality of pixel groups is isolated from other pixels in the first pixel group.

5. The light detecting device of claim 4, wherein the isolation structure includes a dielectric structure.

6. The light detecting device of claim 5, wherein the dielectric structure surrounds each of the pixels within the first pixel group.

7. The light detecting device of claim 6, wherein the dielectric structure includes a full-thickness dielectric trench.

8. The light detecting device of claim 1, wherein the first area corresponds to a first half of the pixel.

9. The light detecting device of claim 8, wherein the second area corresponds to a second half of the pixel.

10. The light detecting device of claim 1, wherein the second readout circuit includes a current to voltage conversion unit and a subtractor, the current to voltage conversion unit including the first log transistor and the first amplification transistor.

11. The light detecting device of claim 1, wherein the second readout circuit further includes a second log transistor and a second amplification transistor.

12. The light detecting device of claim 4, wherein each pixel group further includes a first unit pixel, a second unit pixel, a third unit pixel, and a fourth unit pixel, and wherein the first, second, third, and fourth unit pixels are disposed in a 2×2 array.

13. The light detecting device of claim 12, wherein the isolation structure defines a pixel area for each of the unit pixels, and wherein circuit elements of each unit pixel are separated from circuit elements of any neighboring unit pixel in the pixel array unit by the isolation structure.

14. The light detecting device of claim 1, wherein the isolation structure is entirely a full thickness trench isolation structure.

15. A light detecting device, comprising:
a pixel array unit, wherein the pixel array unit includes:
a plurality of pixels; and
an isolation structure, wherein each pixel in the plurality of pixels is separated from one or more neighboring pixels in the plurality of pixels by the isolation structure, and wherein a pixel of the plurality of pixels includes:
a photoelectric conversion region;
a first transfer transistor;
a second transfer transistor;
a first readout circuit selectively coupled to the photoelectric conversion region by the first transfer transistor; and
a second readout circuit selectively coupled to the photoelectric conversion region by the second transfer transistor.

16. The light detecting device of claim 15, wherein the photoelectric conversion region of at least the pixel is selectively connected to the first and second readout circuits simultaneously.

17. The light detecting device of claim 15, further comprising:
a joint signal line, wherein the first transfer transistor includes a first transfer gate that is one of an N-type transfer gate or a P-type transfer gate, wherein the second transfer transistor includes a second transfer gate that is a-the other one of the N-type transfer gate or the P-type transfer gate, and wherein the joint signal line electrically connects the first transfer gate to the second transfer gate.

18. The light detecting device of claim 15, wherein the first readout circuit includes the first transfer transistor, an amplification transistor, a selection transistor, and a reset transistor.

19. The light detecting device of claim 15, wherein the photoelectric conversion region includes a plurality of sides in a plan view, wherein a gate of the first transfer transistor is located along a first side of the photoelectric conversion region, and wherein a gate of the second transfer transistor is located along a second side of the photoelectric conversion region.

20. An electronic apparatus, comprising:
an imaging lens; and
a light detecting device, including:
a pixel array unit, wherein the pixel array unit includes:
a plurality of pixels; and
an isolation structure, wherein each pixel in the plurality of pixels is separated from one or more neighboring pixels in the plurality of pixels by the isolation structure, and wherein a pixel of the plurality of pixels includes:
a photoelectric conversion region;
a first transfer transistor;
a second transfer transistor;
a first readout circuit selectively coupled to the photoelectric conversion region by the first transfer transistor; and
a second readout circuit selectively coupled to the photoelectric conversion region by the second transfer transistor,
wherein, all transistor components of the first readout circuit are located in a first area of the pixel in a plan view below the photoelectric conversion region, and all transistor components of the second readout circuit are located in a second area of the pixel above the photoelectric conversion region in the plan view, wherein the first readout circuit includes a floating diffusion layer and an amplification transistor, a selection transistor, or a reset transistor, and wherein the second readout circuit includes a first log transistor and a first amplification transistor.

* * * * *